(12) United States Patent
Lu et al.

(10) Patent No.: US 10,665,299 B1
(45) Date of Patent: May 26, 2020

(54) MEMORY DEVICE WITH CHANNEL DISCHARGE BEFORE PROGRAM-VERIFY BASED ON DATA STATE AND SUB-BLOCK POSITION

(71) Applicant: SanDisk Technologies LLC, Addison, TX (US)

(72) Inventors: Ching-Huang Lu, Fremont, CA (US); Hong-Yan Chen, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/385,430

(22) Filed: Apr. 16, 2019

(51) Int. Cl.
| | | |
|---|---|---|
| *G11C 16/04* | (2006.01) | |
| *G11C 16/00* | (2006.01) | |
| *G11C 16/10* | (2006.01) | |
| *G11C 16/08* | (2006.01) | |
| *G11C 16/34* | (2006.01) | |
| *H01L 27/11582* | (2017.01) | |
| *H01L 27/11556* | (2017.01) | |
| *G11C 11/56* | (2006.01) | |

(52) U.S. Cl.
CPC .......... *G11C 16/0483* (2013.01); *G11C 16/08* (2013.01); *G11C 16/10* (2013.01); *G11C 16/3459* (2013.01); *G11C 11/5628* (2013.01); *G11C 16/3436* (2013.01); *H01L 27/11556* (2013.01); *H01L 27/11582* (2013.01)

(58) Field of Classification Search
CPC ..... G11C 16/0483; G11C 16/08; G11C 16/10; G11C 16/3459; H01L 27/11556; H01L 27/11582

USPC ........... 365/185.11, 185.17, 185.18, 185.22, 365/185.28
See application file for complete search history.

(56) References Cited

U.S. PATENT DOCUMENTS

| | | | |
|---|---|---|---|
| 7,355,889 B2 | 4/2008 | Hemink et al. | |
| 8,051,240 B2 | 11/2011 | Dutta et al. | |
| 8,374,031 B2* | 2/2013 | Yuh ..................... | G11C 11/5628 |
| | | | 365/185.17 |
| 9,349,478 B2 | 5/2016 | Yuan et al. | |
| 9,361,993 B1 | 6/2016 | Chen et al. | |
| 10,026,487 B2 | 7/2018 | Chen et al. | |
| 2008/0113479 A1 | 5/2008 | Mokhlesi | |

(Continued)

OTHER PUBLICATIONS

U.S. Appl. No. 16/022,373, filed Jun. 28, 2018 by Lu et al.

(Continued)

*Primary Examiner* — Ly D Pham
(74) *Attorney, Agent, or Firm* — Vierra Magen Marcus LLP

(57) ABSTRACT

Techniques are disclosed for reducing an injection type of read disturb in a memory device. During a program loop, when NAND strings in a selected sub-block are programmed, a pre-verify voltage pulse is applied to a selected word line and to a select gate transistor to discharge the drain-side channel in NAND strings of unselected sub-blocks. The duration of the pulse can vary for the different unselected sub-blocks and can be based on a sub-block programming order. In another aspect, the duration is higher for initial program loops in a program operation, when lower data states are being verified, and then decreases to a lower level for subsequent program loops when higher data states are being verified.

20 Claims, 21 Drawing Sheets

(56) References Cited

U.S. PATENT DOCUMENTS

| | | | |
|---|---|---|---|
| 2009/0086542 A1* | 4/2009 | Lee | G11C 11/5628 |
| | | | 365/185.17 |
| 2014/0112075 A1* | 4/2014 | Dunga | G11C 16/12 |
| | | | 365/185.17 |
| 2019/0057749 A1 | 2/2019 | Chen et al. | |
| 2019/0147955 A1 | 5/2019 | Chen et al. | |

OTHER PUBLICATIONS

International Search Report & the Written Opinion of the International Searching Authority dated Apr. 6, 2020, International Application No. PCT/US2019/067007.

* cited by examiner

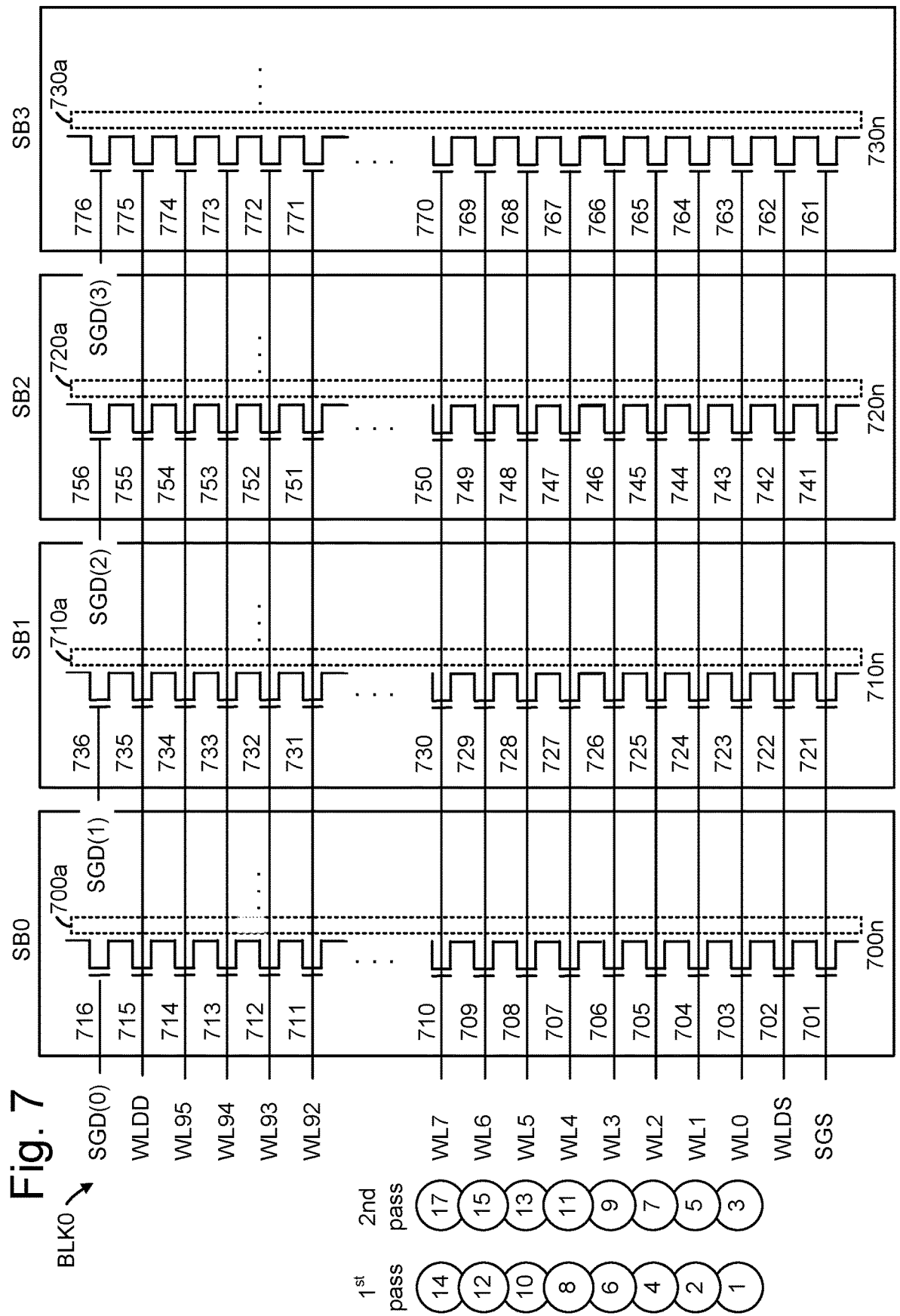

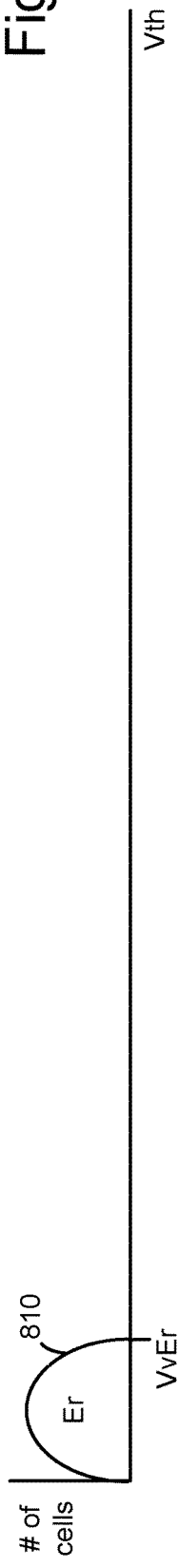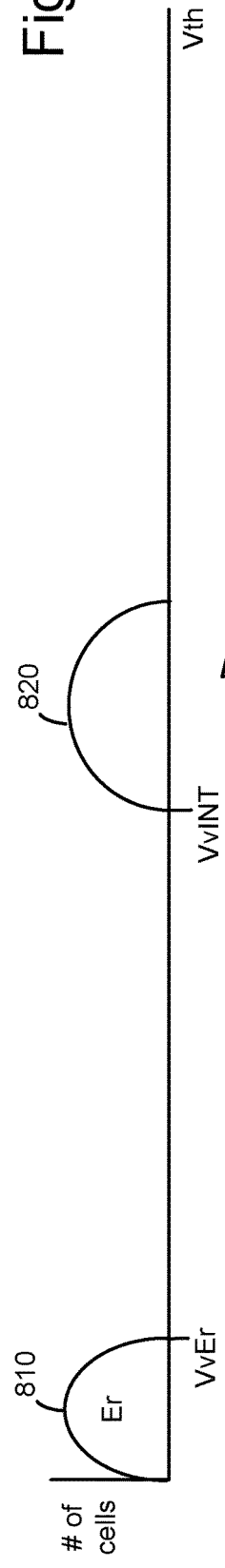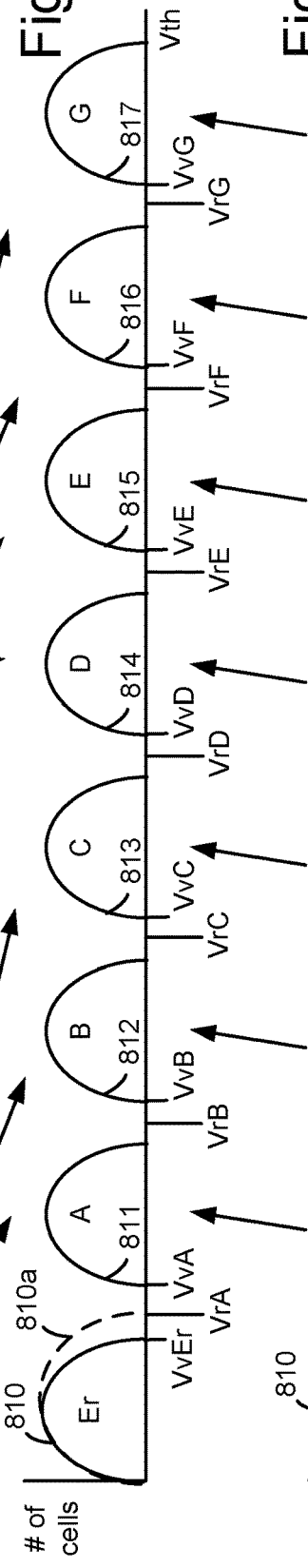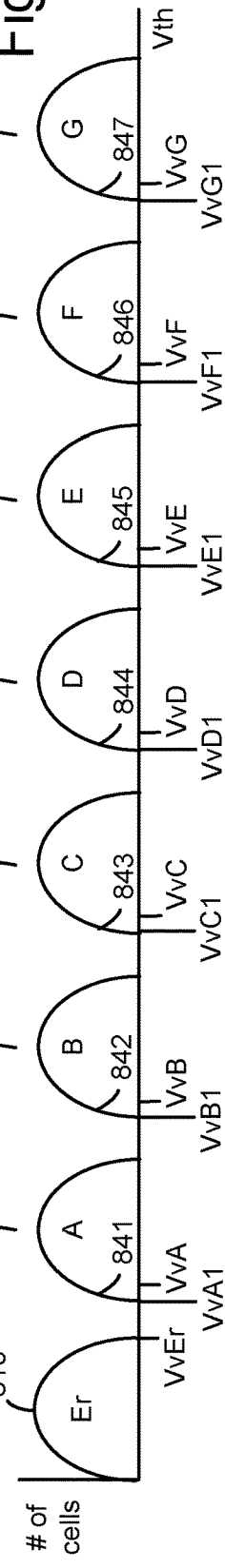

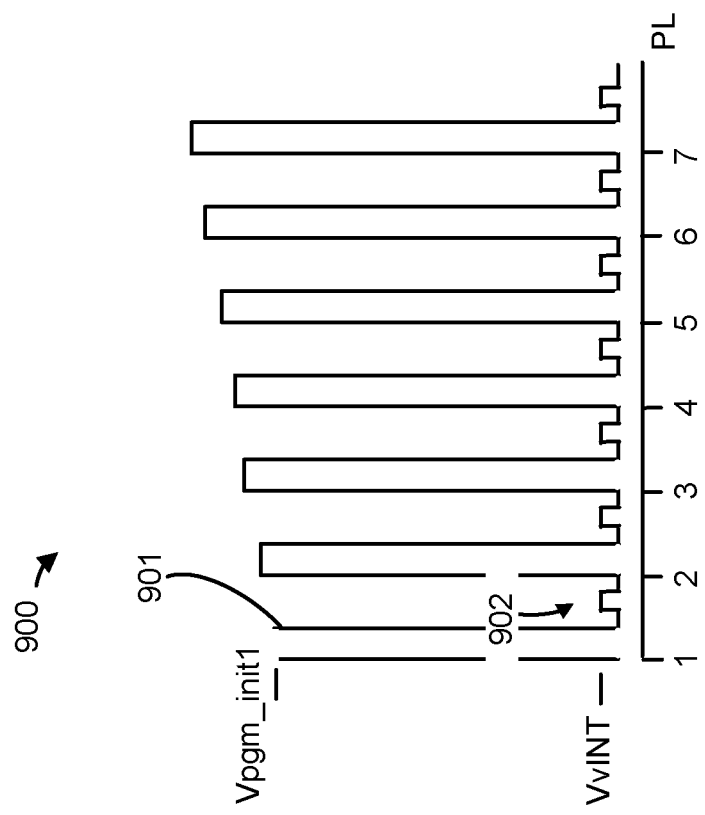

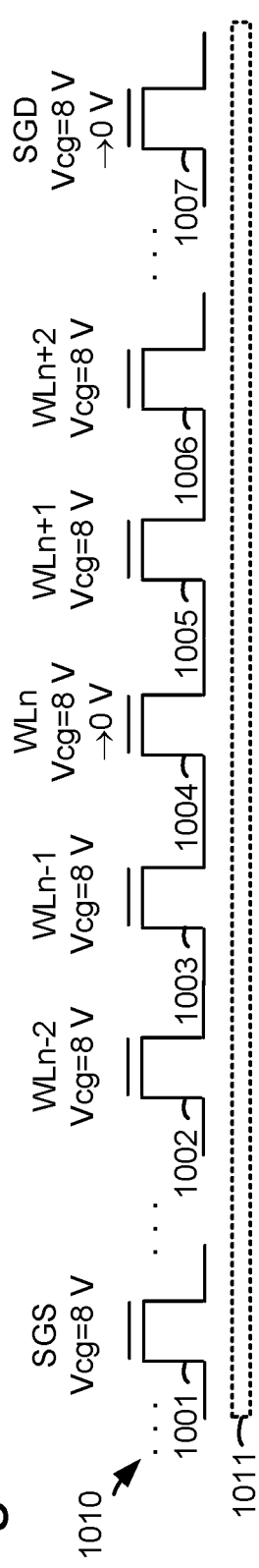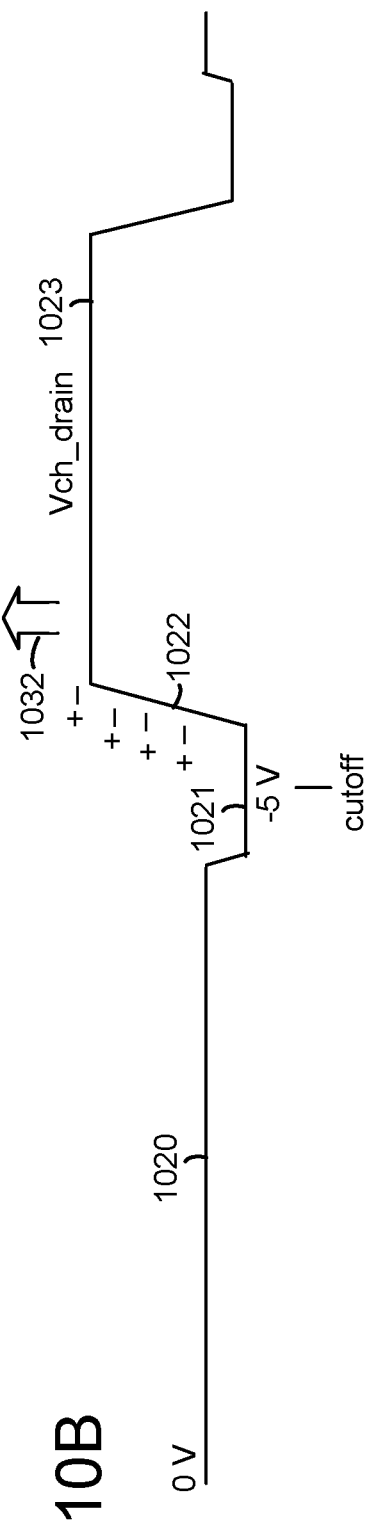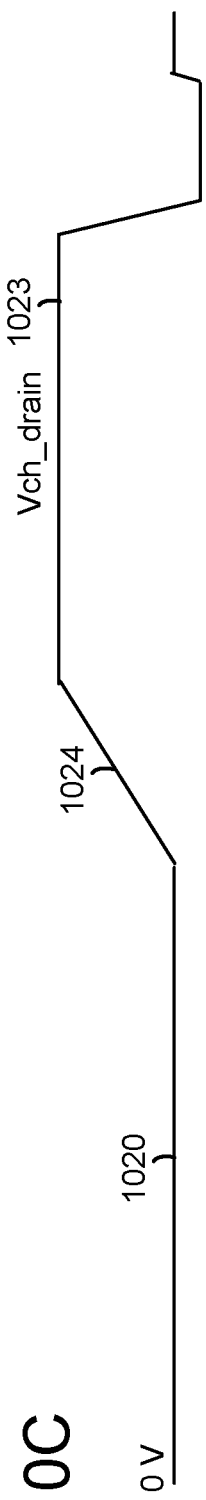

Fig. 14B

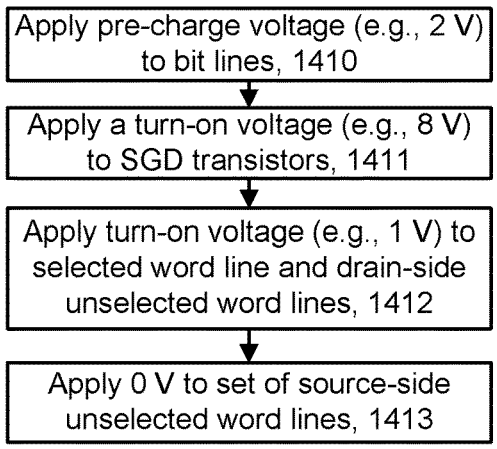

Apply pre-charge voltage (e.g., 2 V) to bit lines, 1410

↓

Apply a turn-on voltage (e.g., 8 V) to SGD transistors, 1411

↓

Apply turn-on voltage (e.g., 1 V) to selected word line and drain-side unselected word lines, 1412

↓

Apply 0 V to set of source-side unselected word lines, 1413

Fig. 14C

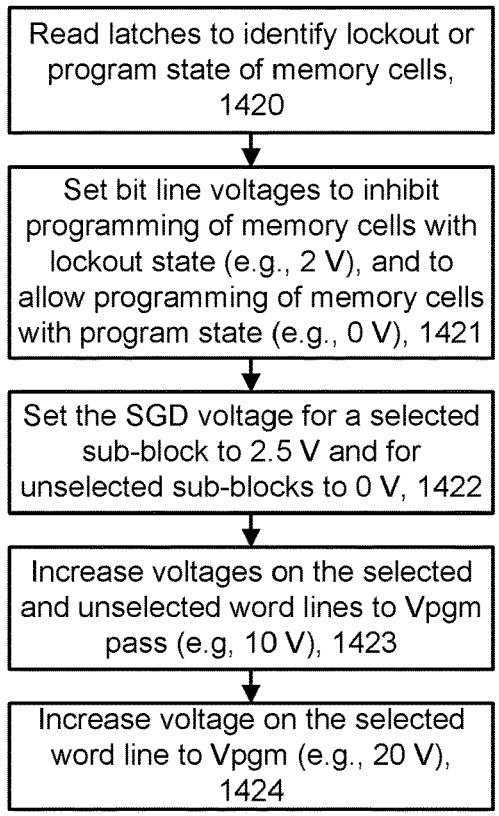

Read latches to identify lockout or program state of memory cells, 1420

↓

Set bit line voltages to inhibit programming of memory cells with lockout state (e.g., 2 V), and to allow programming of memory cells with program state (e.g., 0 V), 1421

↓

Set the SGD voltage for a selected sub-block to 2.5 V and for unselected sub-blocks to 0 V, 1422

↓

Increase voltages on the selected and unselected word lines to Vpgm pass (e.g, 10 V), 1423

↓

Increase voltage on the selected word line to Vpgm (e.g., 20 V), 1424

Fig. 14D

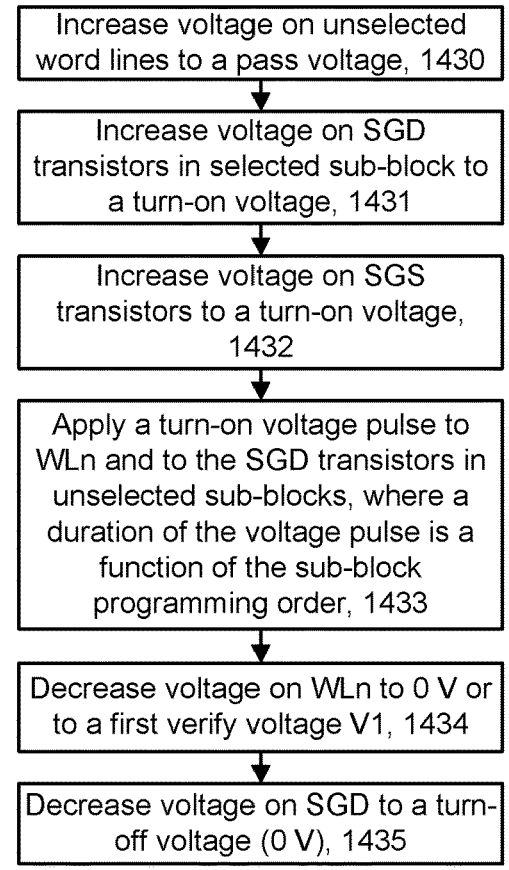

Increase voltage on unselected word lines to a pass voltage, 1430

↓

Increase voltage on SGD transistors in selected sub-block to a turn-on voltage, 1431

↓

Increase voltage on SGS transistors to a turn-on voltage, 1432

↓

Apply a turn-on voltage pulse to WLn and to the SGD transistors in unselected sub-blocks, where a duration of the voltage pulse is a function of the sub-block programming order, 1433

↓

Decrease voltage on WLn to 0 V or to a first verify voltage V1, 1434

↓

Decrease voltage on SGD to a turn-off voltage (0 V), 1435

Fig. 14E

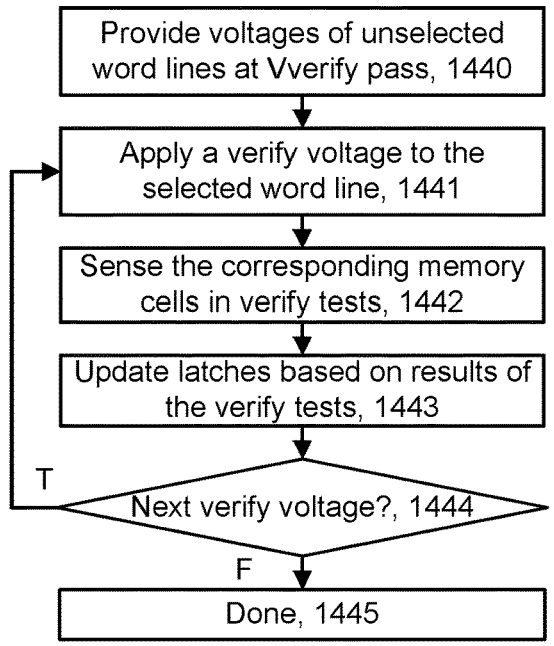

Provide voltages of unselected word lines at Vverify pass, 1440

↓

Apply a verify voltage to the selected word line, 1441

↓

Sense the corresponding memory cells in verify tests, 1442

↓

Update latches based on results of the verify tests, 1443

↓

T ← Next verify voltage?, 1444

F ↓

Done, 1445

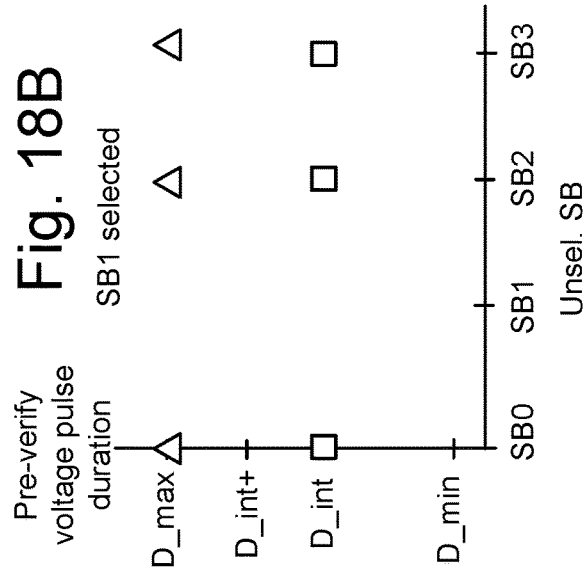
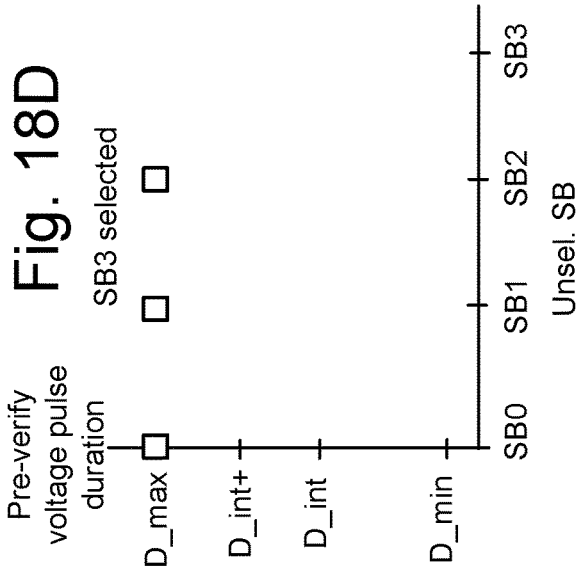
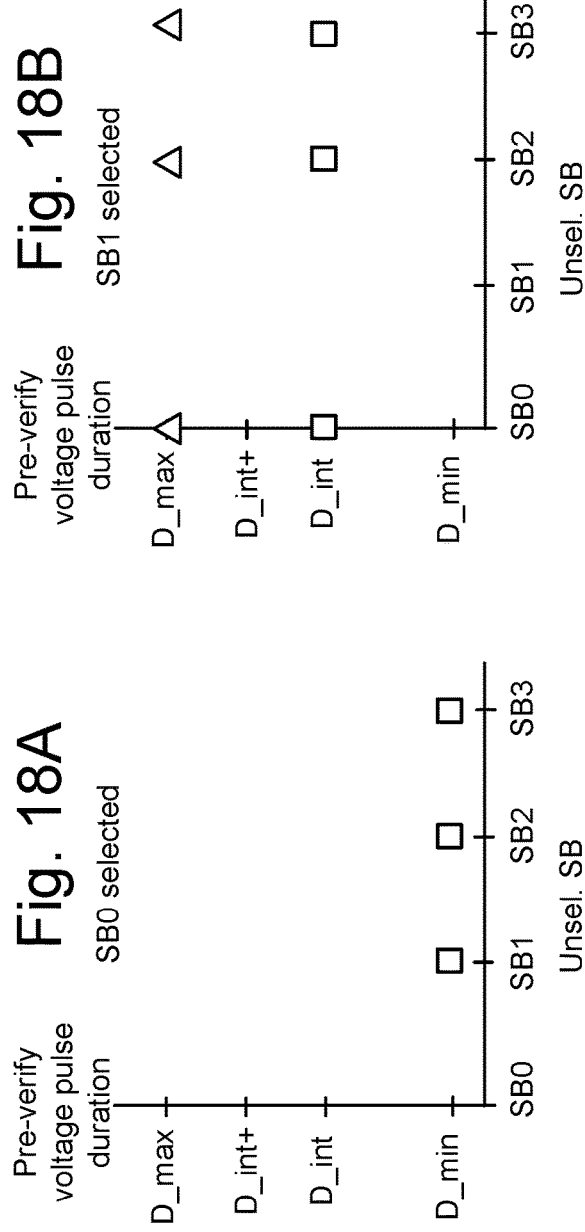
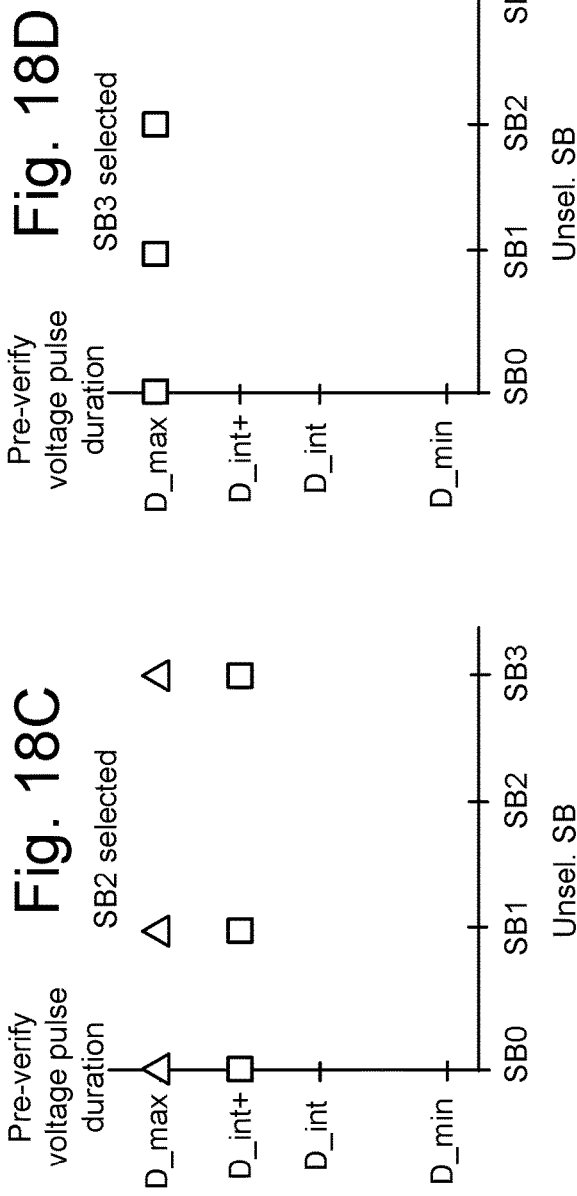

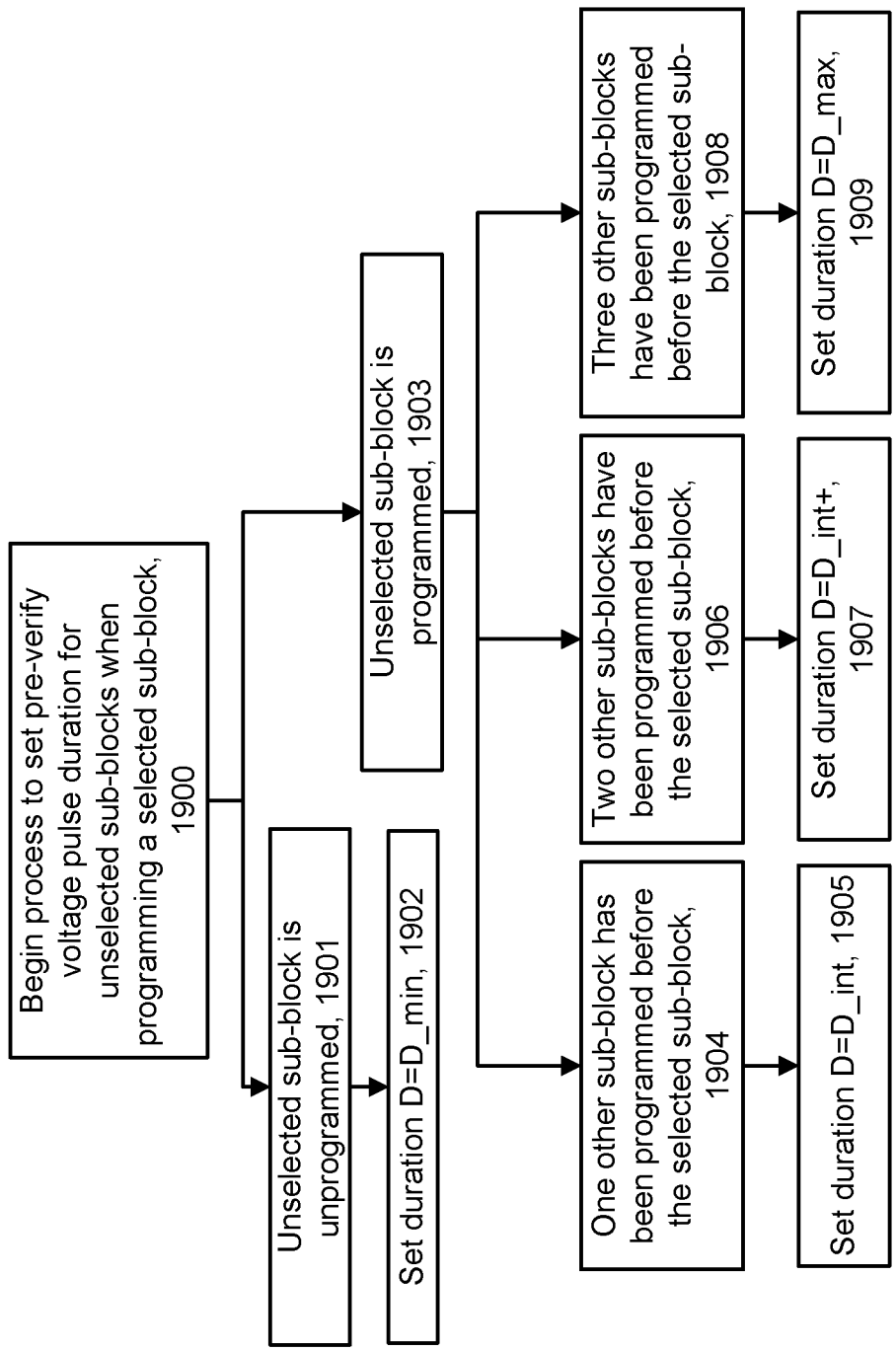

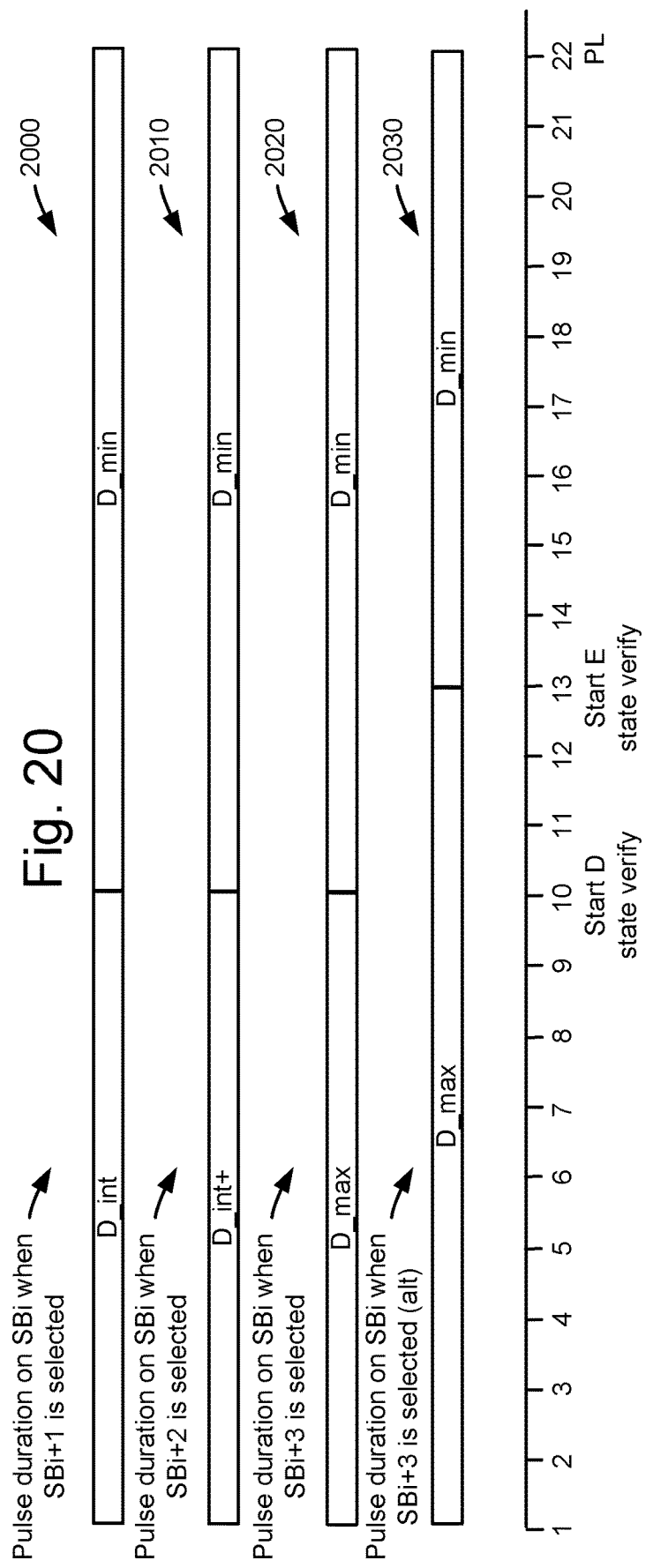

US 10,665,299 B1

MEMORY DEVICE WITH CHANNEL DISCHARGE BEFORE PROGRAM-VERIFY BASED ON DATA STATE AND SUB-BLOCK POSITION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 7 depicts an example view of NAND strings in a block BLK0 which is consistent with FIGS. 4 and 6A.

FIG. 8A depicts example Vth distributions of a set of memory cells at the start of a program operation.

FIG. 8B depicts a Vth distribution of a set of memory cells after the first pass of a first example two-pass program operation.

FIG. 8C depicts a Vth distribution of a set of memory cells after the second pass of the first example two-pass program operation of FIG. 8B or the second example two-pass program operation of FIG. 8D.

FIG. 8D depicts a Vth distribution of a set of memory cells after the first pass of a second example two-pass program operation.

FIG. 9A depicts an example voltage signal used in the first pass of the two-pass program operation of FIG. 8B.

FIG. 10A depicts an example NAND string 1010 and its channel 1011 in an unselected sub-block, showing voltages at the end of a pre-verify voltage pulse, consistent with t7-t8 in FIG. 15A-15D, when the WLn memory cell 1004 is in the G state.

FIG. 10B depicts example channel voltages along the length of the NAND string of FIG. 10A.

FIG. 10C depicts example channel voltages along the length of the NAND string of FIG. 10A, when the WLn memory cell 1004 is in the erased state.

FIG. 14B depicts an example process for performing the pre-charge phase of step 1402 of FIG. 14A.

FIG. 14C depicts an example process for performing the program phase of step 1403 of FIG. 14A.

FIG. 14D depicts an example process for performing the pre-verify phase of step 1404 of FIG. 14A.

FIG. 14E depicts an example process for performing the verify phase of step 1405 of FIG. 14A.

FIG. 15A depicts voltages applied to a selected word line.

FIG. 15B depicts voltages applied to unselected word lines.

FIG. 15C depicts voltages applied to select gate transistors.

FIG. 15D depicts voltages applied to bit lines.

FIG. 18A depicts a plot of the duration D of the pre-verify voltage pulse of FIG. 16 versus an unselected sub-block when SB0 is a selected sub-block.

FIG. 18B depicts a plot of the duration D of the pre-verify voltage pulse of FIG. 16 versus an unselected sub-block when SB1 is a selected sub-block.

FIG. 18C depicts a plot of the duration D of the pre-verify voltage pulse of FIG. 16 versus an unselected sub-block when SB2 is a selected sub-block.

FIG. 18D depicts a plot of the duration D of the pre-verify voltage pulse of FIG. 16 versus an unselected sub-block when SB3 is a selected sub-block.

FIG. 19 depicts a process for setting the duration of a pre-verify voltage pulse for unselected sub-blocks, consistent for FIG. 18A-18D.

FIG. 20 depicts an example of a pre-verify voltage pulse duration in a sub-block SBi as a function of program loop number, consistent with FIG. 9C, when sub-blocks SBi+1 to SBi+3 are selected.

DETAILED DESCRIPTION

Apparatuses and techniques are described for reducing disturbs which occur in connection with a program-verify operation in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 9B:
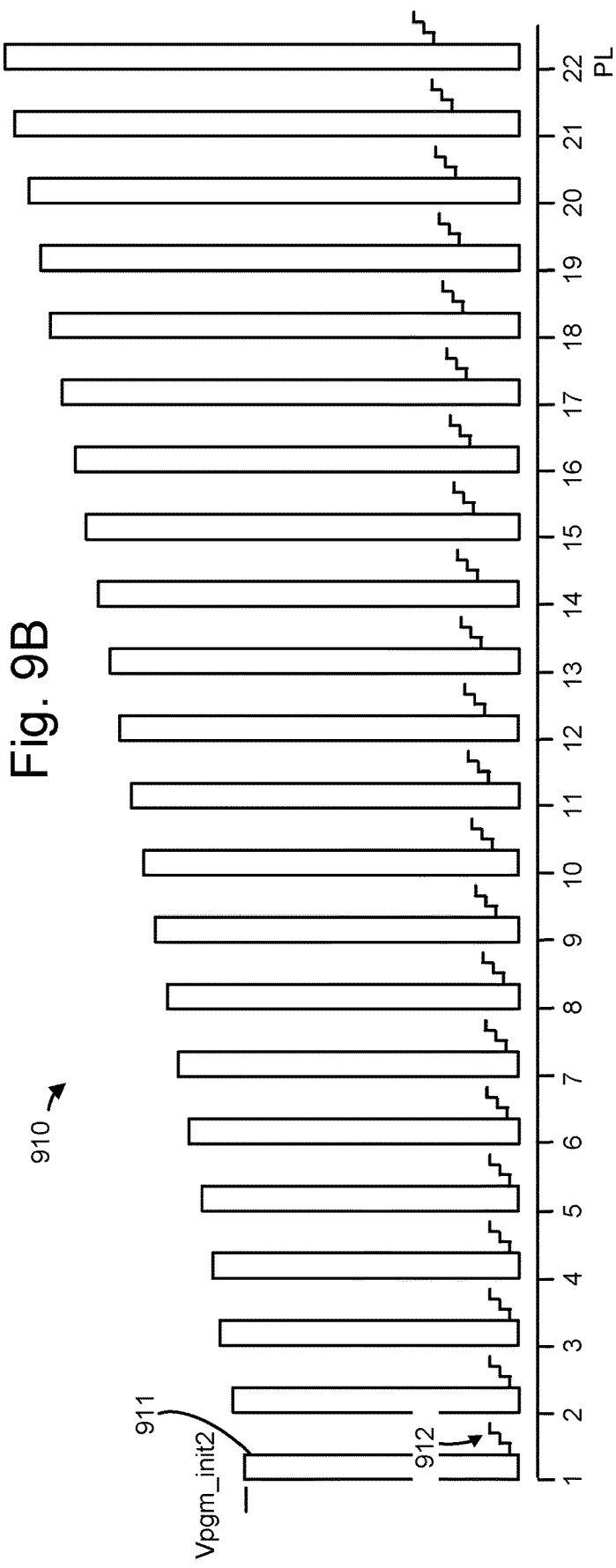
FIG. 9B depicts an example voltage signal used in the first and/or second pass of the two-pass program operation of FIG. 8C or 8D.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9A and 9B. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn-on level which is high enough to place the unselected memory cells in a strongly conductive state, to avoid interfering with the sensing of the selected memory cells.

However, the Vth of a memory cell can change due to disturbs such as an injection type of read disturb. The disturbs, or Vth upshifts, tend to occur in memory cells connected to the drain-side neighboring word line (WLn+1) of the selected word line (WLn) in unselected sub-blocks, when a large gradient is formed in the polysilicon channels of the NAND strings. Injection disturb is not only seen in read operations but also in program-verify operations. A selected sub-block is a sub-block in a block which is currently selected for programming, and an unselected sub-block is a sub-block in the block which is not currently selected for programming.

In particular, in unselected sub-blocks, the channel potential associated with the drain side word lines is boosted up during a voltage increase of the unselected word lines after a program pulse is applied and before a verify voltage is applied. This voltage increase is used to provide the unselected memory cells in a conductive state so that a verify test can be performed for the memory cells connected to WLn. During the increase, the voltage of WLn is set at a verify voltage. When the Vth of a selected memory cell is higher than the verify voltage, the channel region adjacent to the selected memory cell is cutoff or non-conductive, causing a large channel gradient between WLn and WLn+1. Electrons can be generated and injected into the WLn+1 memory cells, causing injection disturb.

A countermeasure is to discharge the drain-side channel potential during the voltage increase on the unselected word lines by applying a pre-verify voltage pulse 1506 and 1536 (FIGS. 15A and 15C) on WLn and on the SGD transistors, respectively. This helps prevent electron generation and injection disturb. However, the required discharge process results in a time penalty. A pre-verify voltage pulse is a voltage pulse applied before a verify test in a program loop.

Techniques provided herein address the above and other issues by optimizing the duration of the pre-verify voltage pulse, or the channel discharge time, thereby reducing the time penalty while still suppressing injection disturb. In one aspect, the duration of the pre-verify voltage pulse is set as a function of the sub-block programming order. In another aspect, the duration of the pre-verify voltage pulse is set based on the magnitude of the verify voltage. In another aspect, a verify pass voltage can be reduced for drain-side word lines.

These and other features are discussed further below.

Figure 1:
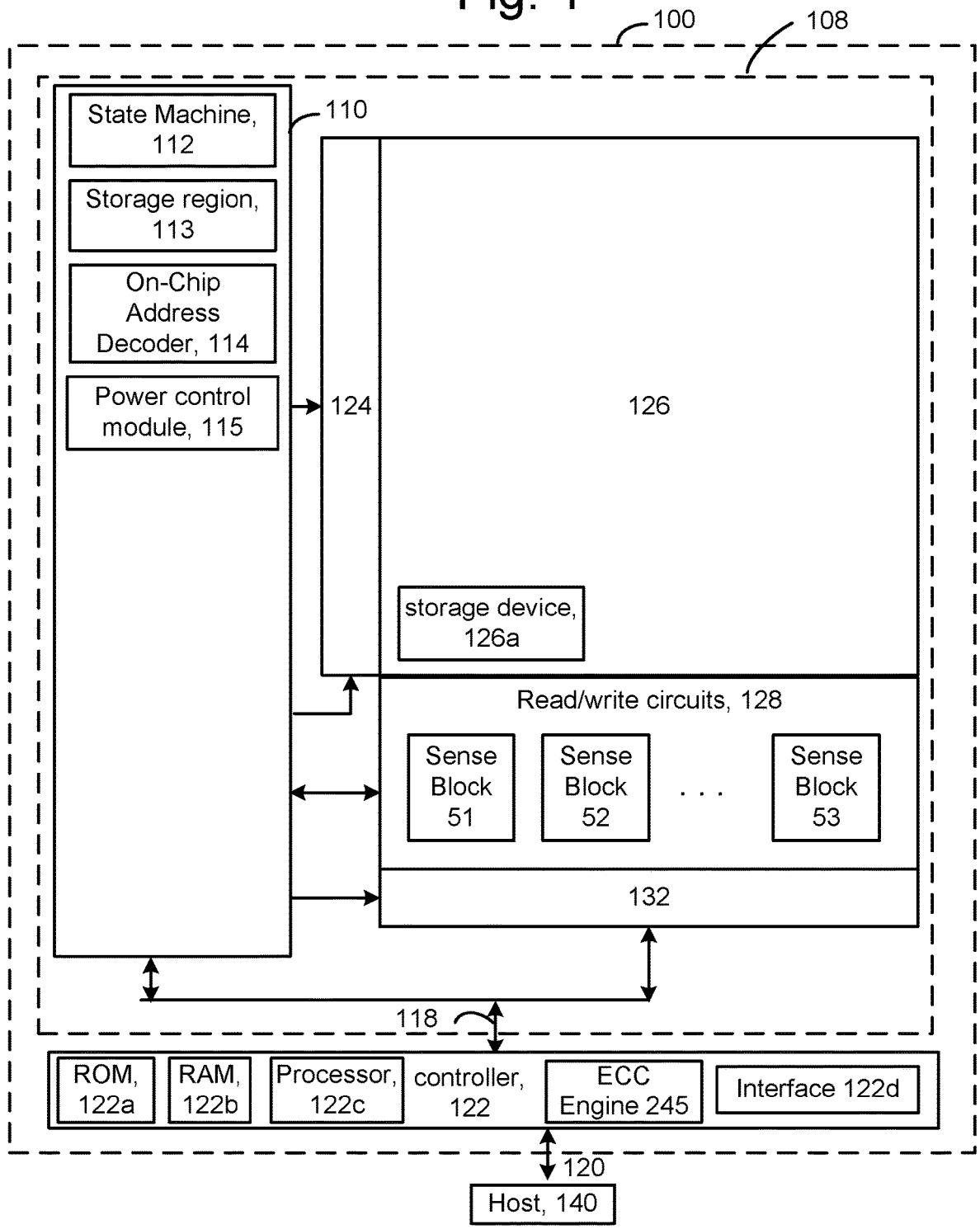
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 115 (power control circuit). A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
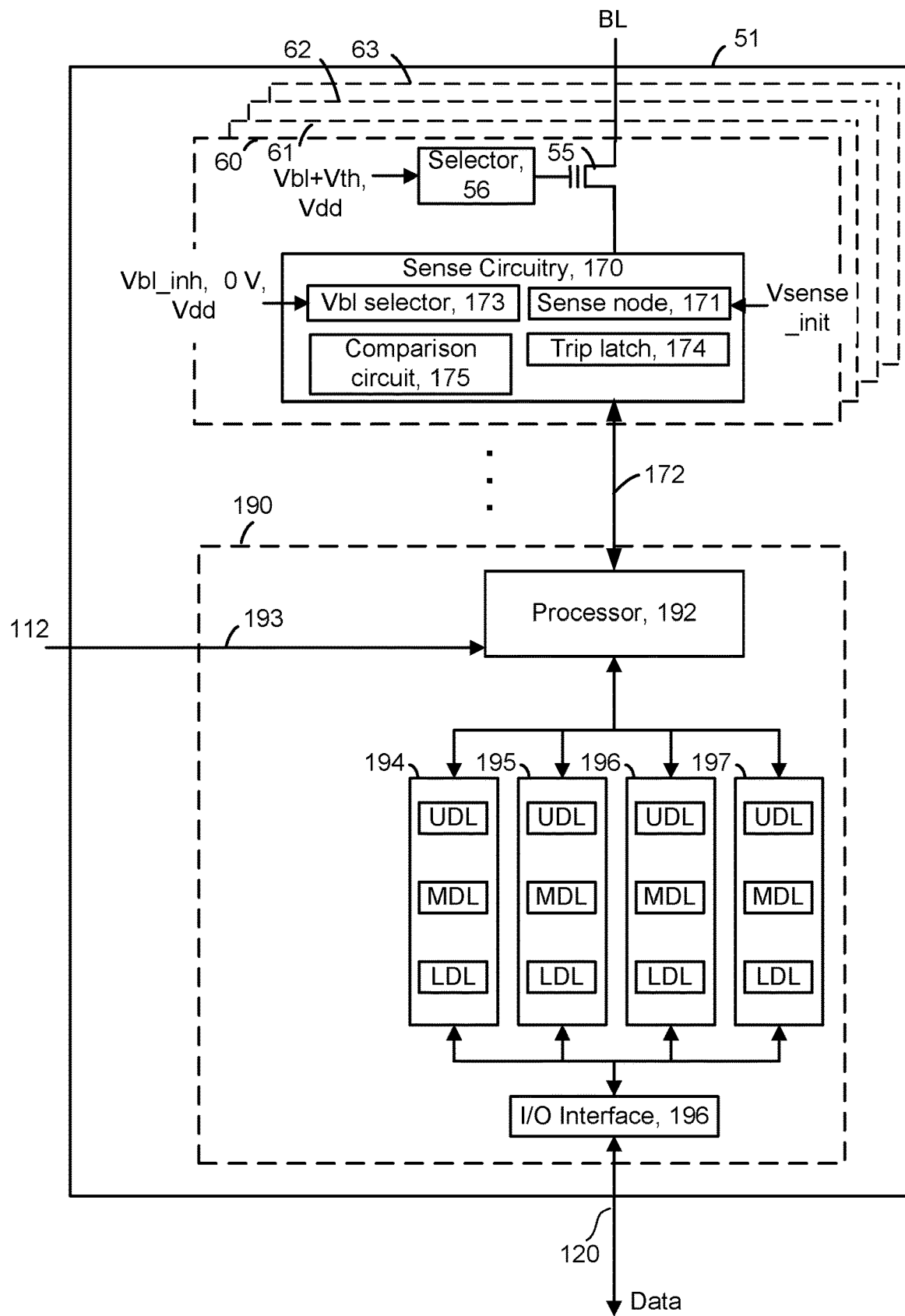
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vb1 selector 173, a sense node 171, a comparison circuit 175 and a trip latch 174. During the application of a program voltage, the Vb1 selector 173 can pass Vb1_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vb1 from the Vb1 selector 173, by setting the control gate voltage of the transistor sufficiently high, e.g., higher than the Vb1 passed from the Vb1 selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vb1+Vth is passed by the selector 56, the bit line voltage will be Vb1. This assumes the source line is at 0 V. The transistor 55 clamps the bit line voltage according to the control gate voltage and acts a source-follower rather than a pass gate. The Vb1 selector 173 may pass a relatively high voltage such as Vdd which is higher than the control gate voltage on the transistor 55 to provide the source-follower mode. During sensing, the transistor 55 thus charges up the bit line. An example Vb1 during sensing is 0.5 V.

In one approach, the selector 56 of each sense circuit can be controlled separately from the selectors of other sense circuits, to pass Vb1 or Vdd. The Vb1 selector 173 of each sense circuit can also be controlled separately from the Vb1 selectors of other sense circuits.

During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
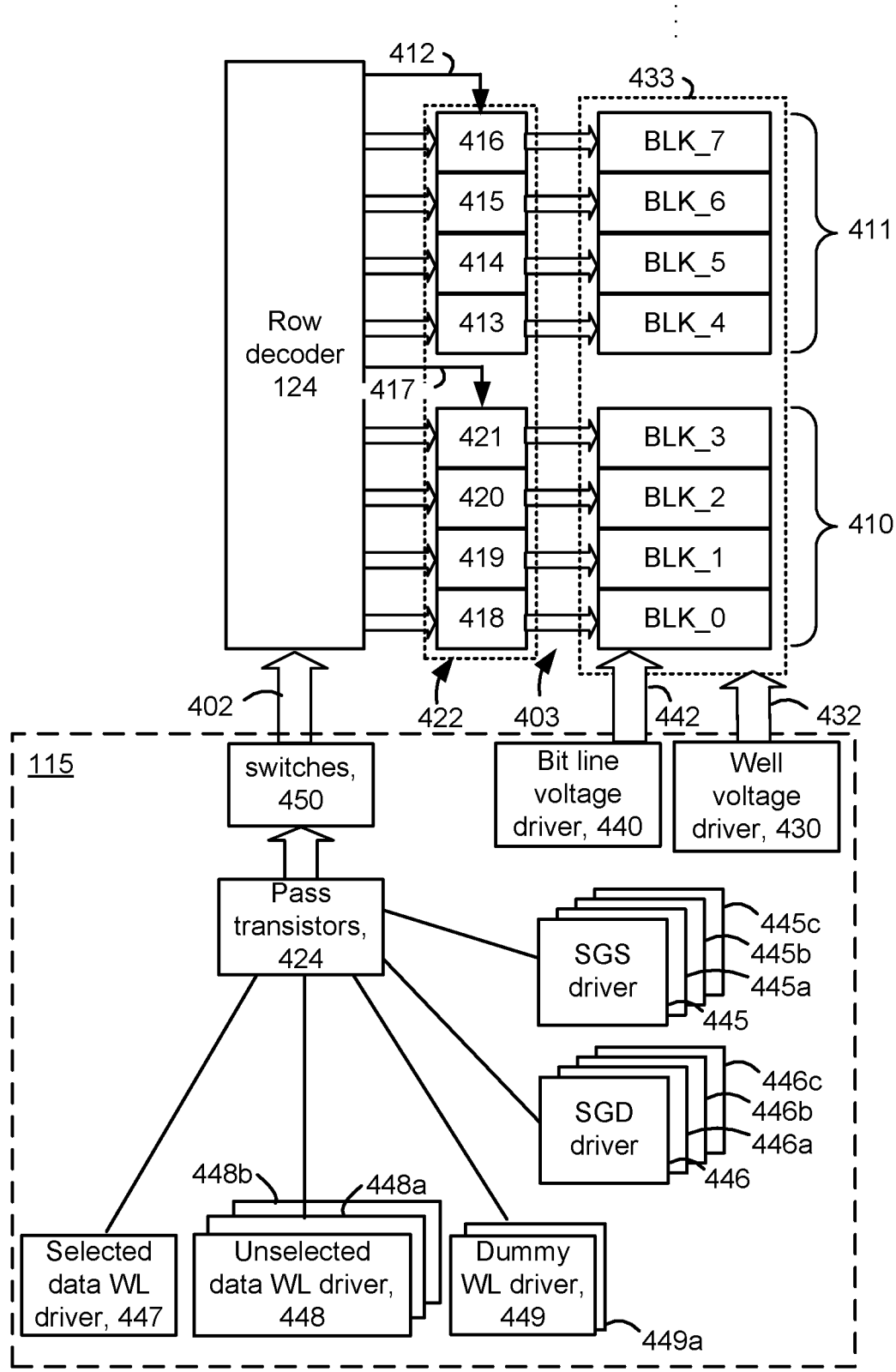
FIG. 3 depicts an example implementation of the power control module 115 of FIG. 1 for providing voltages to blocks of memory cells.

FIG. 3 depicts an example implementation of the power control module 115 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
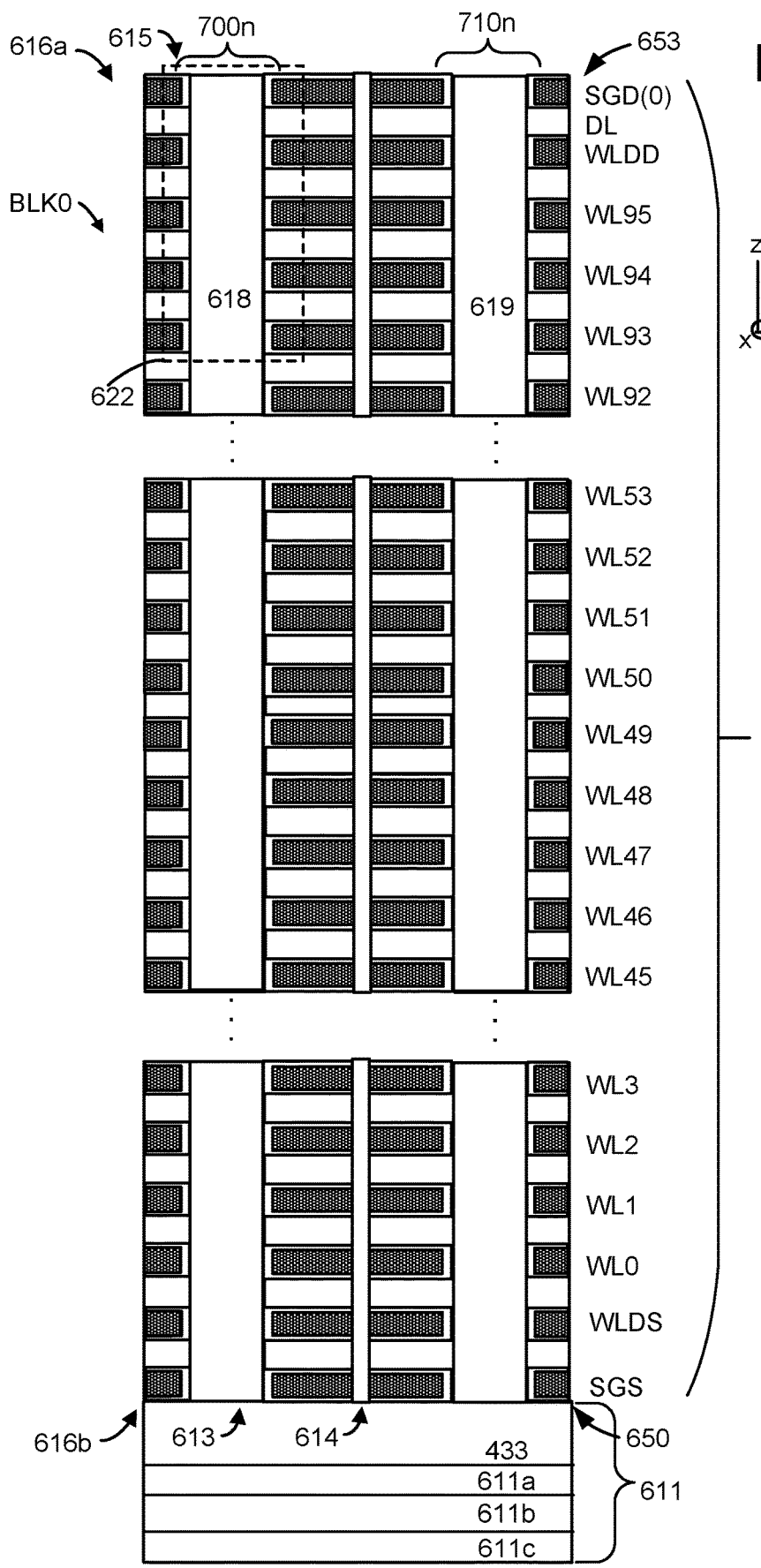
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, drivers 448, 448*a* and 448*b* for unselected data word lines, and dummy word line drivers 449 and 449*a* which provide voltages on dummy word lines WLDD and WLDS, respectively, in FIG. 6A. For example, during a channel boosting adjustment operation as described herein, such as in step 1405 of FIG. 14A, the driver 447 may be used to apply a pre-verify voltage pulse to WLn. The driver 448 may be used to apply a normal pass voltage such as 8 V, the driver 448*a* may be used to apply a high pass voltage such as 9 V and the driver 448*b* may be used to apply a low pass voltage such as 4-5 V.

Figure 16:
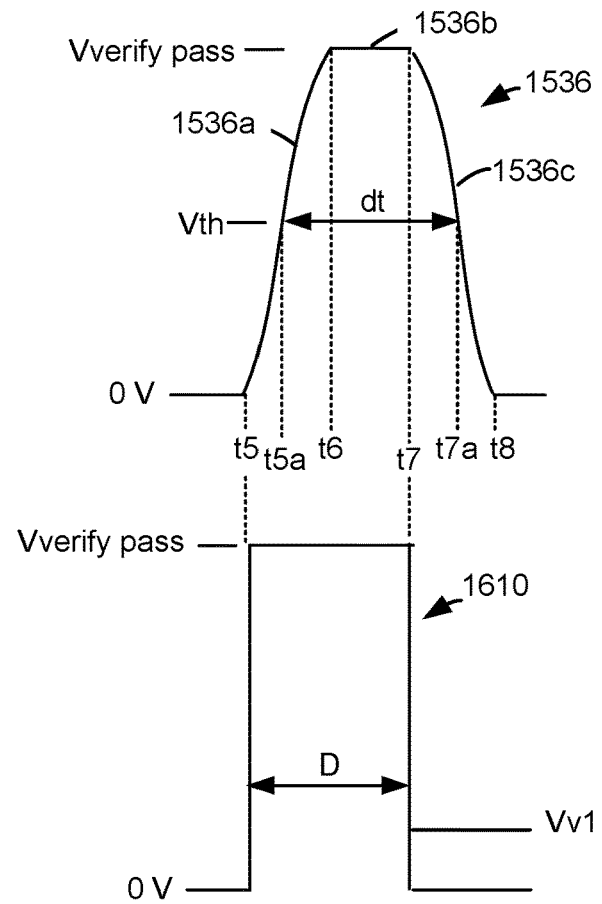
FIG. 16 depicts a close up view of the pre-verify voltage pulse 1536 of FIG. 15C and a corresponding plot 1610 of a control signal for a voltage driver.

The voltage drivers can also include separate SGS and SGD drivers for each sub-block. For example, SGS drivers 445, 445*a*, 445*b* and 445*c*, and SGD drivers 446, 446*a*, 446*b* and 446*c* can be provided for SB0, SB1, SB2 and SB3, respectively, such as in FIG. 7. In another option, one SGS driver is common to the different sub-blocks in a block. For example, during a channel boosting adjustment operation as described herein, the driver 446 may be used to apply a pre-verify voltage pulse to the SGD transistors in unselected sub-blocks. FIG. 16 provides further details of how a driver can provide a pre-verify voltage pulse.

The various components, including the row decoder, may receive commands from a controller such as the state machine 112 or the controller 122 to perform the functions described herein.

The well voltage driver 430 provides a voltage Vs1 to the well region 611*a* in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
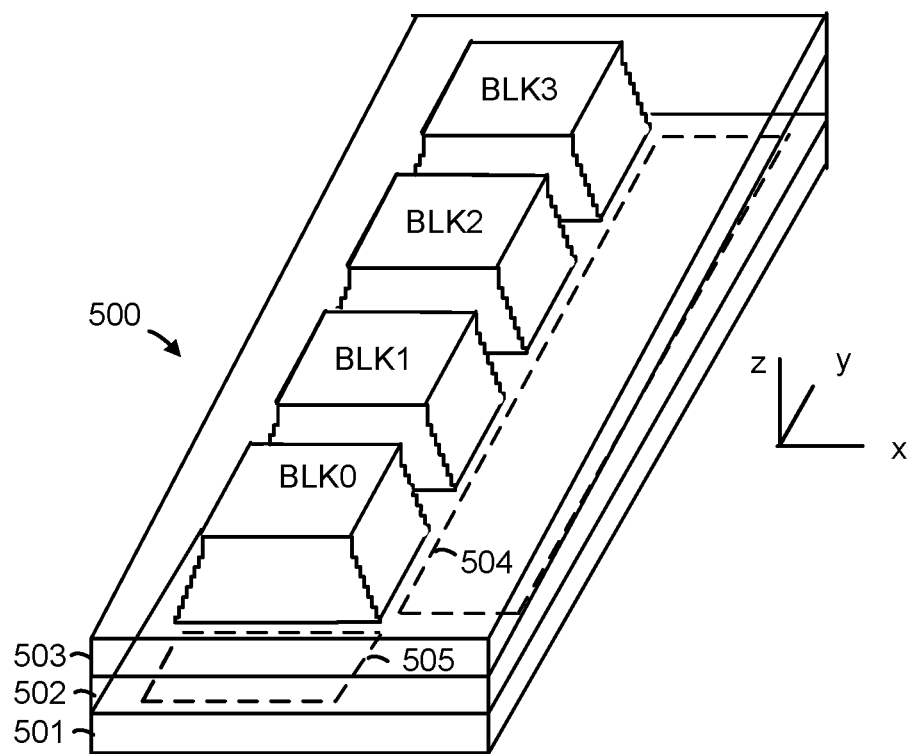
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
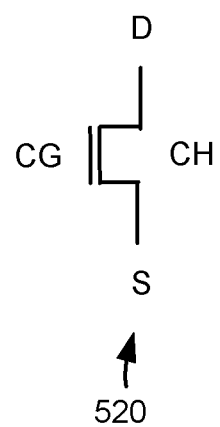
FIG. 5 depicts an example transistor 520.

FIG. 5 depicts an example transistor 520. The transistor comprises a control gate CG, a drain D, a source S and a channel CH and may represent a memory cell or a select gate transistor, for example.

FIG. 6A depicts an example cross-sectional view of a portion of BLK0 of FIG. 4, including NAND strings 700n and 710n. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

Figure 6B:
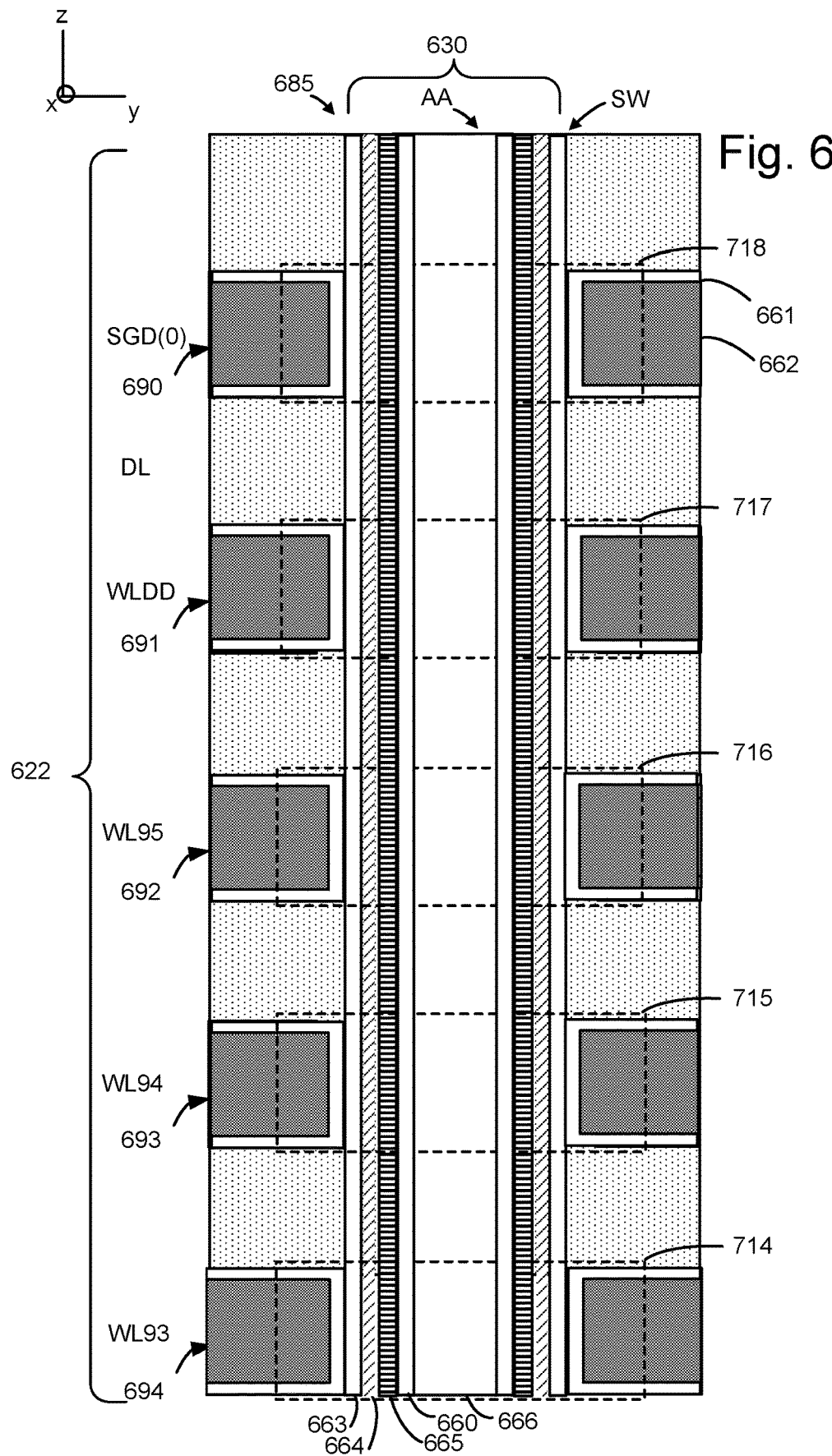
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. An SGD transistor 718 connected to SGD (0), a dummy memory cell 717 connected to WLDD and data memory cells 714-716 connected to WL93-WL95, respectively, are depicted.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride ($Si_3N_4$) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line and sub-block programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

Furthermore, a back and forth word line programming order may be used, as depicted by the numbered circles next to the word lines. The numbers range from 1-23 and are arranged in first and second columns which denote the first and second program passes, respectively. For example, "1" denotes the first program pass for WL0, "2" denotes the first program pass for WL1, "3" denotes the first second program pass for WL0, "4" denotes the first program pass for WL2, and so forth. In this case, the two program passes for a word line are interrupted by a program pass on one or both adjacent word lines. See also FIG. 8A-8D.

The NAND strings 700n, 710n, 720n and 730n have channels 700a, 710a, 720a and 730a, respectively.

Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 8A depicts example Vth distributions of a set of memory cells at the start of a program operation. In FIG. 8A-8D, the vertical axis depicts a number of memory cells on a logarithmic scale, and the horizontal axis depicts a Vth of the memory cells on a linear scale. At a start of a program operation, the memory cells are all initially in the erased state, as represented by the Vth distribution 810.

FIG. 8B depicts a Vth distribution of a set of memory cells after the first pass of a first example two-pass program operation. The memory cells assigned to the A-C states (or the bottom half of the programmed states) are not programmed and continue to be represented by the Vth distribution 810. The memory cells assigned to the D-G states (or the top half of the programmed states) are programmed until their Vth exceeds a verify voltage of VvINT. These memory cells are represented by the Vth distribution 820. This programming pass can use the program signal of FIG. 9A, for example.

FIG. 8C depicts a Vth distribution of a set of memory cells after the second pass of the first example two-pass program operation of FIG. 8B or the second example two-pass program operation of FIG. 8D. In the first example two-pass program operation of FIG. 8B, the Er state memory cells of the Vth distribution 810 remain in the Vth distribution and are not programmed. As represented by the arrows extending between FIGS. 8B and 8C, the memory cells assigned to the A-C states are programmed to the Vth distributions 811-813 respectively, using the verify voltages VvA-VvC, respectively, and the memory cells assigned to the D-G states are programmed to the Vth distributions 814-817, respectively, using the verify voltages VvD-VvG, respectively.

In the second pass of the second example two-pass program operation of FIG. 8D, the Er state memory cells of the Vth distribution 810 remain in the Vth distribution and are not programmed. As represented by the arrows extending between FIGS. 8C and 8D, the memory cells assigned to the A-G states are programmed to the Vth distributions 811-817 respectively, using the verify voltage VvA-VvG, respectively.

The Vth distribution 810a represents the Er state memory cells after they have been disturbed due to the injection type of disturb discussed herein. See further below for an additional discussion of the upshift of the upper tail of the Er state memory cells.

FIG. 8D depicts a Vth distribution of a set of memory cells after the first pass of a second example two-pass program operation. The memory cells assigned to the A-G states are programmed to the Vth distributions 841-847, respectively, using verify voltages of VvA1-VvG1, respectively. These verify voltages are offset slightly below the final verify voltages of FIG. 8C. This programming pass can use the program signal of FIG. 9B, for example.

The first example two-pass program operation has the advantage that the first pass is relatively fast since the programming does not have to be very accurate. However, the second program pass can result in some neighbor word line disturb since the increase in Vth in the second pass is relatively large. The first pass is a lower-middle or LM pass since the Vth distribution 820 is in the middle of the Vth distributions of the data states, and the second pass is a fine pass since it provides narrow Vth distributions.

The second example two-pass program operation has the advantage that the second program pass avoids neighbor word line disturb since the increase in Vth in the second pass is relatively small. The first pass consumes more time than in the first example two-pass program operation since the programming has to be very accurate. The first pass is a foggy or coarse pass since the Vth distributions 841-847 can be wider than the final Vth distributions 811-817, and the second pass is a fine pass since it provides narrow Vth distributions. The first pass is a foggy programming pass of a foggy-fine multi-pass program operation.

The multi-pass programming can be extended to more than two passes.

In an example single-pass program operation, the memory cells transition from the erased state Vth distribution 810 of FIG. 8A to the final Vth distributions of FIG. 8C.

Read voltages VrA-VrG can be used for reading the states of the memory cells in a read operation. These verify voltages and read voltages are examples of control gate read levels of the selected word line voltage.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight-state example. The number of data states could be higher or low than eight data states.

FIG. 9A depicts an example voltage signal used in the first pass of the two-pass program operation of FIG. 8B. During a program operation, program loops are performed for a selected word line in a selected sub-block. A program loop comprises a program portion in which a program voltage or pulse is applied to the selected word line followed by a verify portion in which one or more verification signals are applied to the selected word line. During the application of the verification signal, verify operations, also referred to as verify tests, are performed for the associated memory cells.

Moreover, in this example of multi-pass programming, several program loops are performed in both the first and second program passes. In the first program pass, a voltage signal 900 includes a set of program voltages, including an initial program voltage 901, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level, Vpgm_int1, and increases in a step in each successive program loop, for instance, until the program pass is completed. The program pass is successfully completed when the threshold voltages of the memory cells assigned to the higher data states reach the intermediate verify voltage VvINT as shown in FIG. 8B. An example verify voltage pulse 902 is also depicted.

FIG. 9B depicts an example voltage signal used in the first and/or second pass of the two-pass program operation of FIG. 8C or 8D. A voltage signal 910 includes a set of program voltages or pulses, including an initial program voltage 911, which are applied to a word line selected for programming. The initial program voltage, Vpgm_init2 can be different in the first and second passes. Other program parameters such as program voltage step size can be different, e.g., smaller, in the second program pass than in the first program pass.

Figure 9C:
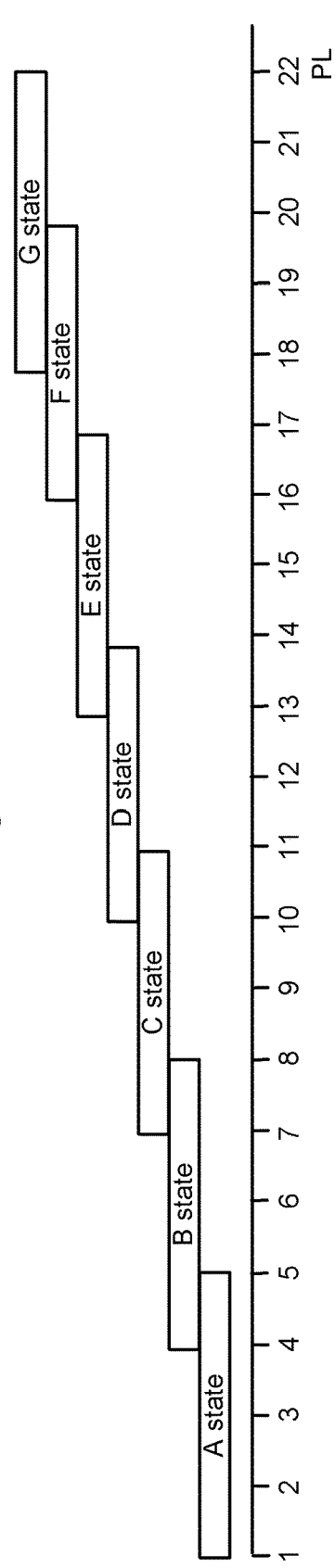
FIG. 9C depicts an example of verify voltages used in different program loops of FIG. 9B.

The verification signals in each program loop, including example verification signals 912, can encompass lower assigned data states and then midrange assigned data states and then higher assigned data states as the program operations proceeds, as depicted in FIG. 9C. The example verification signals depict three verify voltages as a simplification. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. The data of the lower, middle and upper pages can be determined by reading the memory cells using read voltages of VrA and VrE; VrB, VrD and VrF; and VrC and VrG, respectively.

FIG. 9C depicts an example of verify voltages used in different program loops of FIG. 9B. The horizontal bars are time-aligned with the program loop axis of FIG. 9A. The bars overlap in some program loops, indicating that verify operations can be performed for multiple data states in the program loop. The bars indicate that verify voltages for the A, B, C, D, E, F and G states are applied in verification signals in program loops 1-5, 4-8, 7-11, 10-14, 13-17, 16-20 and 18-22, respectively.

FIG. 10A depicts an example NAND string 1010 and its channel 1011 in an unselected sub-block, showing voltages at the end of a pre-verify voltage pulse, consistent with t7-t8 in FIG. 15A-15D, when the WLn memory cell 1004 is in the G state. As mentioned, a pre-verify voltage pulse can be applied to the SGD transistors and to WLn when the unselected word line voltages increase in preparation for the verify tests. This helps reduce and control the channel boosting level.

The NAND string includes memory cells 1001-1007 which are connected to word lines WLn–x and WLn–2 to WLn+2, respectively. WLn–x is x word lines away from WLn on the source-side of WLn. In this example, the memory cells connected to WL0 through WLn have been previously programmed in the unselected sub-block at the time memory cells connected to WLn are being programmed in the selected sub-block. The data states to which the memory cells are programmed is random but some data patterns are more likely to cause a disturb. For example, assume the memory cell 1004 is programmed to a high state with Vth=5 V (such as the G state in FIG. 8C). At the end of the pre-verify voltage pulse, the WLn and SGD voltage is decreased from 8 V to 0 V, for example. With 0 V on WLn and a Vth of 5 V, the channel region associated with the memory cell 1004 is strongly cutoff with a voltage of –5 V (0-5) as represented by the plot 1021 in FIG. 10B. The cutoff is strong because there is a significant under drive, e.g., the amount by which the Vth of the memory cell exceeds the control gate voltage.

At this time, the verify pass voltage of 8 V continues on the remaining word lines including WLn+1. The SGD transistor is cutoff so that the drain-side channel region maintains a boosting level of Vch_drain, e.g., a few Volts. A channel region associated with the SGD transistor may be at –2 V, for example, assuming a Vth of 2 V. The SGS transistor remains conductive so that 0 V continues to be passed to the source-side channel region.

FIG. 10B depicts example channel voltages along the length of the NAND string of FIG. 10A. A plot 1020 depicts the voltage of the source-side channel region (on the source side of WLn) at 0 V, a plot 1021 depicts the channel region of WLn at −5 V, as discussed, a plot 1022 depicts a channel gradient between WLn and WLn+1 and a plot 1023 depicts the voltage of the drain-side channel region (on the drain side of WLn) at Vch_drain. The channel gradient between WLn and WLn+1 generates electron-hole pairs, where the electrons are represented by "−" and the holes are represented by "+". The electrons are attracted to the memory cell 1005 of WLn+1 and can be injected into the charge trapping layer, as represented by an arrow 1032, causing the injection type of disturb. The level of Vch_drain is a function of the duration of the pre-verify voltage pulse, such that Vch_drain is lower when the duration is greater since more electrons can be removed from the drain-side channel region at the drain end of the NAND string.

FIG. 10C depicts example channel voltages along the length of the NAND string of FIG. 10A, when the WLn memory cell 1004 is in the erased state. The Vth of a memory cell in the erased state may be −1 V so that the associated channel region is not strongly cutoff when the WLn voltage decreases to 0 V at the end of the pre-verify voltage pulse. As a result, the plot 1024 represents a much lower channel gradient compared to the plot 1022 of FIG. 10A, so that the amount of electrons generated and the corresponding risk of injection disturb is much smaller.

Figure 11A:
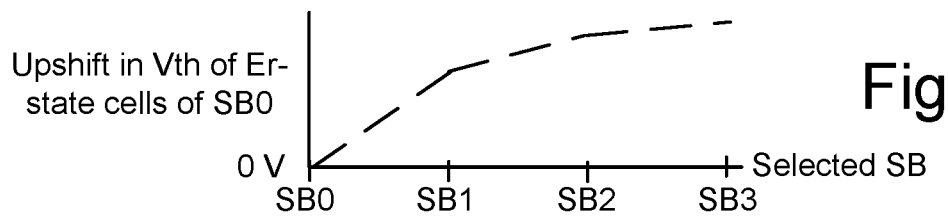
FIG. 11A depicts a plot of an upshift in the Vth of Er-state cells of WLn+1 in SB0 of FIG. 7 as a function of a selected sub-block.

FIG. 11A depicts a plot of an upshift in the Vth of Er-state cells of WLn+1 in SB0 of FIG. 7 as a function of a selected sub-block. The upshift or disturb is strongest on the Er-state cells, and tends to increase the upper tail of the Vth distribution as shown by the Vth distribution 810a of FIG. 8C. Additionally, the upshift is stronger in a sub-block which has been exposed to the channel gradient of FIG. 10B more often. Assuming a sub-block programming order of SB0, SB1, SB2 and then SB3 for a selected word line WLn, the memory cells of WLn+1 in SB0 will be exposed to the channel gradient most often, e.g., when the memory cells of WLn in SB1, SB2 and SB3 are programmed. The memory cells of WLn+1 in SB1 will be exposed to the channel gradient the second most often, e.g., when the memory cells of WLn in SB2 and SB3 are programmed. The memory cells of WLn+1 in SB2 will be exposed to the channel gradient the third most often, e.g., when the memory cells of WLn in SB3 are programmed. The memory cells of WLn+1 in SB3 will not be exposed to the channel gradient because no memory cells of WLn are programmed after the memory cells of WLn in SB3 are programmed.

That is, each time the memory cells of WLn in a selected sub-block are programmed, the memory cells of WLn+1 in an unselected sub-block are exposed to the disturb-inducing condition of FIG. 10B. The condition involves two parts. The first part is that the memory cells of WLn are programmed to a high state with a high Vth so that the channel is cutoff at the end of the pre-verify voltage pulse. The second part is that the pre-verify voltage pulse is applied. Thus, the disturb will occur in a sub-block in which the memory cells of WLn have been previously programmed and not when the memory cells of WLn are unprogrammed (erased).

FIG. 11A indicates that there is zero upshift for the WLn+1 memory cells of SB0 when SB0 is the selected sub-block, because the pre-verify voltage pulse is not applied in the selected sub-block. The upshift increases to a first higher level when SB1 is programmed, to a second higher level when SB2 is programmed and to a highest level when SB3 is programmed.

Figure 11B:
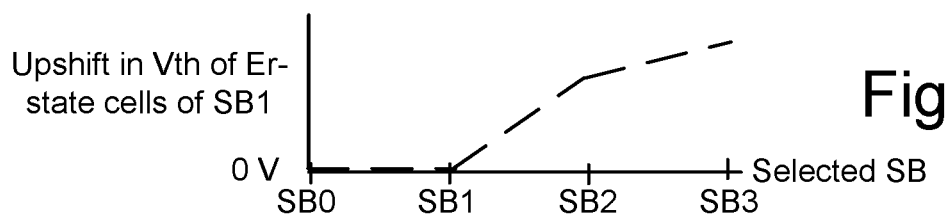
FIG. 11B depicts a plot of an upshift in the Vth of Er-state cells of WLn+1 in SB1 of FIG. 7 as a function of a selected sub-block.

FIG. 11B depicts a plot of an upshift in the Vth of Er-state cells of WLn+1 in SB1 of FIG. 7 as a function of a selected sub-block. There is no upshift when the memory cells of WLn in SB0 are programmed because the memory cells of WLn in SB1 are in the erased state at this time, so that the first part mentioned above is not met. There is also no upshift when the memory cells of WLn in SB1 are programmed because the pre-verify voltage pulse is not applied in the selected sub-block. There is an upshift when the memory cells of WLn in SB2 are programmed because the memory cells of WLn in SB1 are programmed at this time. There is a further upshift when the memory cells of WLn in SB3 are programmed because the memory cells of WLn in SB1 are programmed at this time.

Figure 11C:
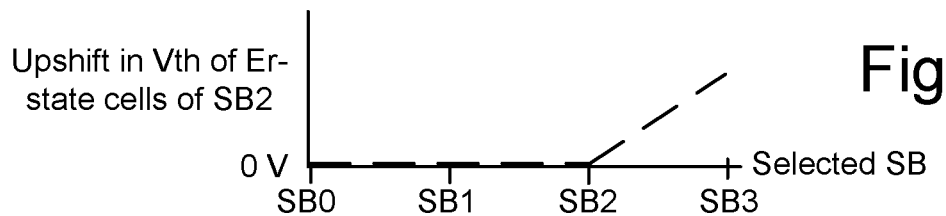
FIG. 11C depicts a plot of an upshift in the Vth of Er-state cells of WLn+1 in SB2 of FIG. 7 as a function of a selected sub-block.

FIG. 11C depicts a plot of an upshift in the Vth of Er-state cells of WLn+1 in SB2 of FIG. 7 as a function of a selected sub-block. There is no upshift when the memory cells of WLn in SB0 and SB1 are programmed because the memory cells of WLn in SB2 are in the erased state at this time. There is no upshift when the memory cells of WLn in SB2 are programmed because the pre-verify voltage pulse is not applied in the selected sub-block. There is an upshift when the memory cells of WLn in SB3 are programmed because the memory cells of WLn in SB2 are programmed at this time.

Figure 11D:
FIG. 11D depicts a plot of an upshift in the Vth of Er-state cells of WLn+1 in SB3 of FIG. 7 as a function of a selected sub-block.

FIG. 11D depicts a plot of an upshift in the Vth of Er-state cells of WLn+1 in SB3 of FIG. 7 as a function of a selected sub-block. There is no upshift when the memory cells of WLn in SB0-SB2 are programmed because the memory cells of WLn in SB3 are in the erased state at this time. There is no upshift when the memory cells of WLn in SB3 are programmed because the pre-verify voltage pulse is not applied in the selected sub-block.

Figure 12:
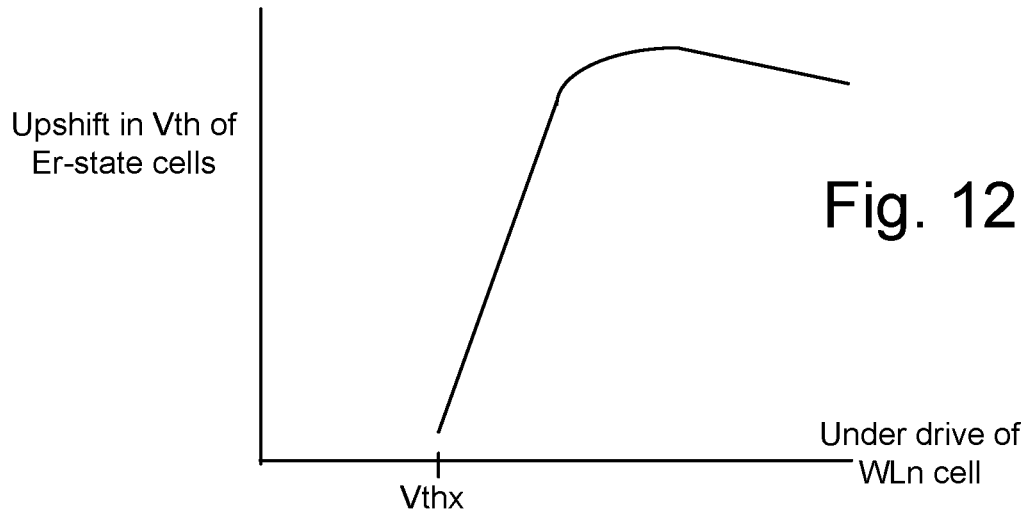
FIG. 12 depicts a plot of an upshift in the Vth of Er-state cells of WLn+1 as a function of an under drive of the WLn memory cell, consistent with FIG. 10A-10C.

FIG. 12 depicts a plot of an upshift in the Vth of Er-state cells of WLn+1 as a function of an under drive of the WLn memory cell, consistent with FIG. 10A-10C. The upshift is for WLn+1 memory cells in an unselected sub-block. As mentioned in connection with FIGS. 10A and 10B, the channel region adjacent to WLn is cutoff when the under drive (Vth-Vcg) of the WLn cell is sufficiently high, in the NAND strings of an unselected sub-block. When the under drive is below a threshold level, Vthx, there is no upshift in the upper tail of the Vth distribution. When the under drive exceeds Vthx, there is significant upshift in the upper tail of the Vth distribution. The under drive is highest when the WLn memory cell is in the highest programmed state. A large upshift in the upper tail of the Vth distribution can result in read errors.

Figure 13A:
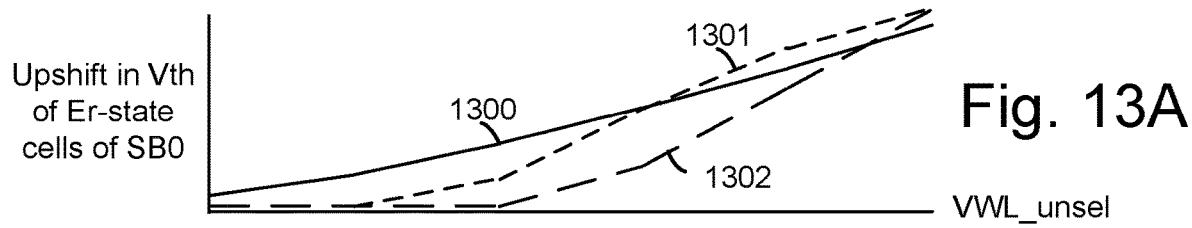
FIG. 13A depicts a plot of an upshift in the Vth of Er-state cells of WLn+1 in SB0 of FIG. 7 as a function of a pass voltage.

FIG. 13A depicts a plot of an upshift in the Vth of Er-state cells of WLn+1 in SB0 of FIG. 7 as a function of a pass voltage. See also FIG. 13E. The pass voltage in this case is a verify pass voltage which is applied to unselected word lines during the verify tests, and during the pre-verify voltage pulse. The pass voltage should be sufficiently high to place the memory cells in a strongly conductive state. A normal pass voltage such as 8 V can be applied to the source-side word lines WL0-WLn−2. A high pass voltage such as 9 V can be applied to WLn−1, the source-side adjacent word line of WLn. This helps to turn on a portion of the channel which is between WLn−1 and WLn since this channel portion has a reduced fringing field from WLn when the relatively low verify voltage is applied.

If a multi-pass, back and forth word line program order is used such as discussed in connection with FIG. 7, the memory cells of WLn+1 may be partly programmed at the time WLn is programmed. In this case, WLn+1 can have a similar high pass voltage as WLn−1. If a single-pass program operation is used, the memory cells of WLn+1 will be erased at the time WLn is programmed. In this case, a low pass voltage such as 4-5 V can be applied to WLn+1. The memory cells of WLn+2 to WL95 will be erased so that the low pass voltage can be applied.

The figure shows that injection disturb, as represented by an upshift in the Vth of the Er-state cells of WLn+1 in SB0, is higher when the pass voltages are higher. When the drain-side pass voltage is greater, the channel gradient between WLn and WLn+1 is greater (FIGS. 10A and 10B), so that the likelihood of injection disturb is greater. Plot 1300 represents the upshift due to changes in the pass voltage on WLn+1, plot 1301 represents the upshift due to changes in the pass voltage on WLn+2 to WL95, and plot 1302 represents the upshift due to changes in both of the above pass voltages. The plots show that lowering the pass voltages is effective in suppressing the injection disturb of the WLn+1 memory cells. Moreover, lowering the pass voltage on WLn+2 to WL95 is more effective than lowering the pass voltage on WLn+1.

Figure 13B:
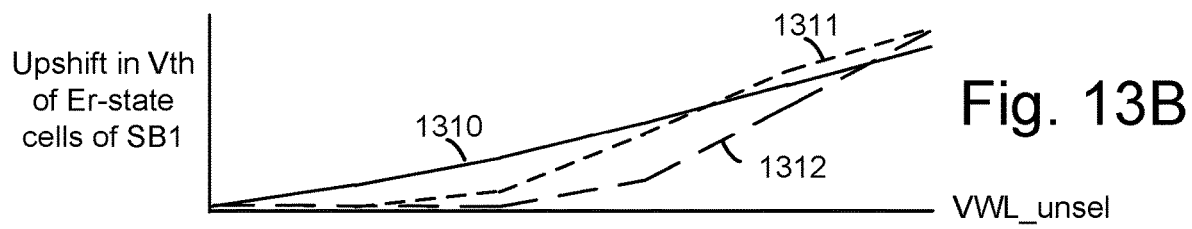
FIG. 13B depicts a plot of an upshift in the Vth of Er-state cells of WLn+1 in SB1 of FIG. 7 as a function of a pass voltage.

FIG. 13B depicts a plot of an upshift in the Vth of Er-state cells of WLn+1 in SB1 of FIG. 7 as a function of a pass voltage. Plot 1310 represents the upshift due to changes in the pass voltage on WLn+1, plot 1311 represents the upshift due to changes in the pass voltage on WLn+2 to WL95, and plot 1312 represents the upshift due to changes in both of the above pass voltages.

Figure 13C:
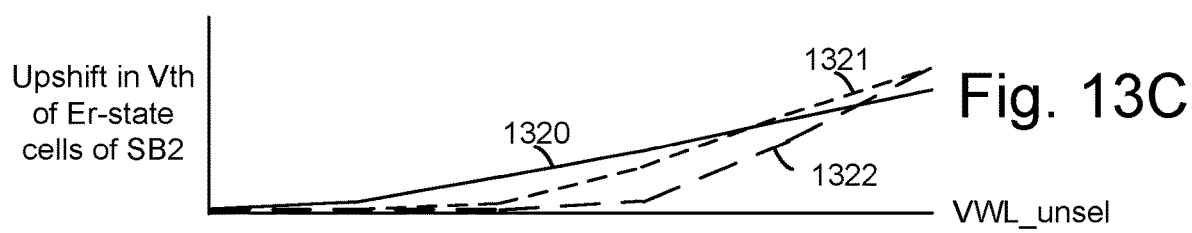
FIG. 13C depicts a plot of an upshift in the Vth of Er-state cells of WLn+1 in SB2 of FIG. 7 as a function of a pass voltage.

FIG. 13C depicts a plot of an upshift in the Vth of Er-state cells of WLn+1 in SB2 of FIG. 7 as a function of a pass voltage. Plot 1320 represents the upshift due to changes in the pass voltage on WLn+1, plot 1321 represents the upshift due to changes in the pass voltage on WLn+2 to WL95, and plot 1322 represents the upshift due to changes in both of the above pass voltages.

Figure 13D:
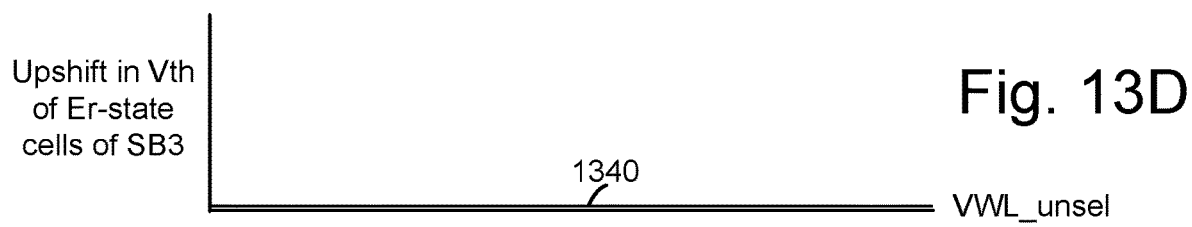
FIG. 13D depicts a plot of an upshift in the Vth of Er-state cells of WLn+1 in SB3 of FIG. 7 as a function of a pass voltage.

FIG. 13D depicts a plot of an upshift in the Vth of Er-state cells of WLn+1 in SB3 of FIG. 7 as a function of a pass voltage. A plot 1340 shows that there is no upshift since there is no injection disturb, regardless of the pass voltage.

Figure 13E:
FIG. 13E depicts an example of verify pass voltages, consistent with FIG. 13A-13D.

FIG. 13E depicts an example of verify pass voltages, consistent with FIG. 13A-13D. As mentioned, a normal verify pass voltage can be applied to WL0 to WLn−2, a high verify pass voltage can be applied to WLn−1, a high or low verify pass voltage can be applied to WLn+1 for multi-program pass or single-pass program operation, respectively, and a low verify pass voltage can be applied to WLn+2 to WL95. WLn+1 is an adjacent drain-side word line of WLn and WLn−1 is an adjacent source-side word line of WLn. WLn+2 to WL95 are remaining drain-side word lines, and WL0 to WLn−2 are remaining source-side word lines.

Figure 14A:
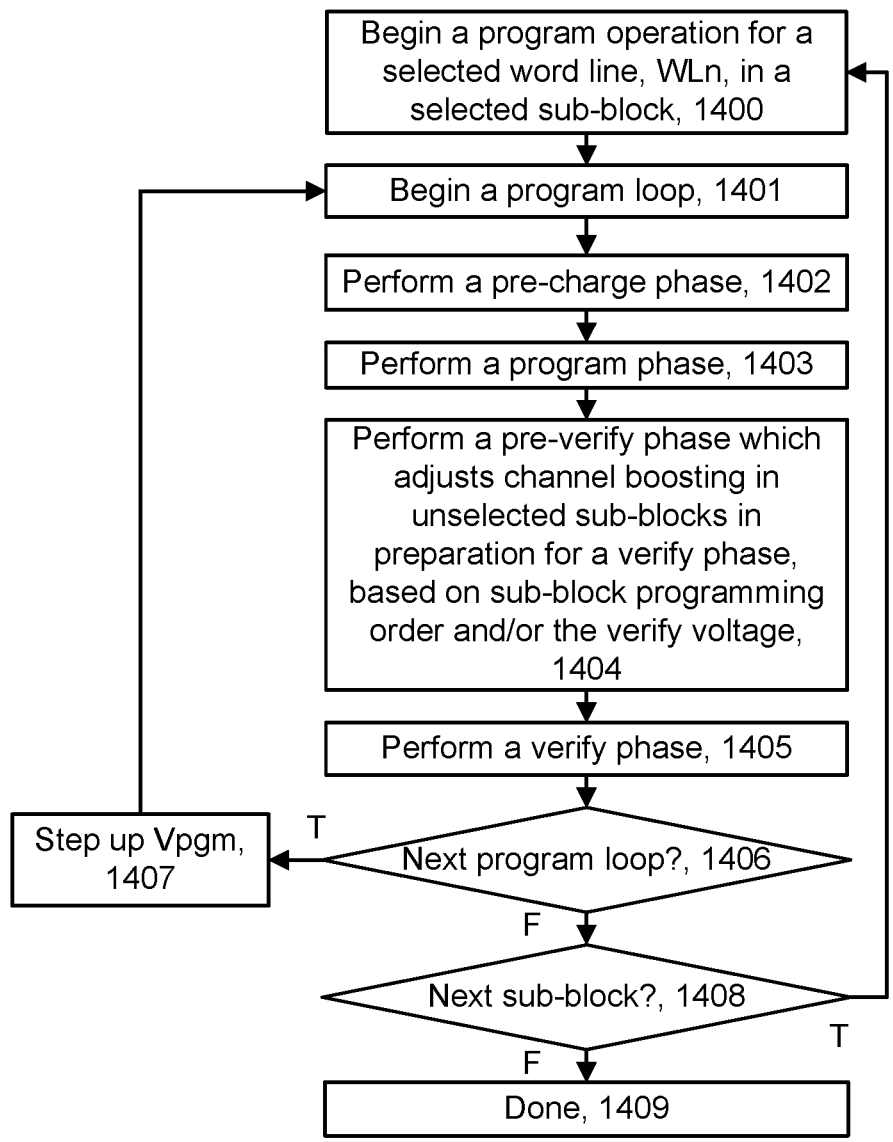
FIG. 14A depicts an example process for performing a program operation for a selected word line, where a program loop includes a pre-verify phase before the verify phase.

FIG. 14A depicts an example process for performing a program operation for a selected word line, where a program loop includes a pre-verify phase before the verify phase. Step 1400 begins a program operation for a selected word line, WLn, in a selected sub-block. Step 1401 begins a program loop. Step 1402 involves performing a pre-charge phase 1590 (FIG. 15A-15D) of the program loop. Step 1403 involves performing a program phase 1591 of the program loop. Step 1404 involves performing a pre-verify phase which involves adjusting a channel boosting in the unselected sub-blocks in preparation for a verify phase, based on the sub-block programming order and/or the verify voltage of the current program loop. See the pre-verify phase 1592. Step 1405 involves performing a verify phase 1593 of the program loop.

A decision step 1406 determines if there is a next program loop. A next program loop may be performed if many memory cells have not completed programming or are otherwise not in the lockout state. If this is true, step 1407 steps up Vpgm, and a next program loop begins at step 1401. If decision step 1406 is false, a decision step 1408 determines if there is a next sub-block to program. If the decision step 1408 is false, step 1409 ends the program operation. The program operation may be ended when all, or nearly all of the memory cells connected to WLn are in the lockout state. If the decision step 1408 is true, step 1400 is reached and the programming of WLn continues in the next sub-block.

The steps 1402-1405 can be performed sequentially as depicted in FIG. 15A-15D.

FIG. 14B depicts an example process for performing the pre-charge phase of step 1402 of FIG. 14A. The different steps can be performed concurrently. Step 1410 includes applying a pre-charge voltage (e.g., 2 V) to bit lines (plot 1542 in FIG. 15D). Step 1411 includes applying a turn-on voltage (e.g., 8 V) to SGD transistors (plot 1532 in FIG. 15C). Step 1412 includes applying a turn-on voltage (e.g., 1 V) to the selected word line (plot 1502 in FIG. 15A) and the drain-side unselected word lines (plot 1522 in FIG. 15B). A small positive voltage such as 1 V is typically high enough to provide the memory cells of the drain-side unselected word lines in a conductive state since these memory cells are in the erased state with a Vth=−1 V, for instance. This allows the bit line voltage to be passed in the drain-side channel region. The small positive voltage is also high enough to provide the memory cells of the selected word line in a conductive state at the start of the programming when these memory cells are in the erased state. Step 1413 includes applying 0 V to the set of source-side unselected word lines (plot 1523 in FIG. 15B). The memory cells of the source-side unselected word lines have been programmed so that their Vth will be as high as 5 V, for instance. The source side channel region will be non-conductive and is therefore not pre-charged.

FIG. 14C depicts an example process for performing the program phase of step 1403 of FIG. 14A. Step 1420 includes reading the latches of the selected memory cells to identify the lockout or program state of the memory cells. Step 1421 includes setting the bit line voltages in a block to inhibit programming of memory cells with the lockout state, e.g., by setting Vbl_unsel=2 V (plot 1544 in FIG. 15D), and to allow programming of memory cells with the program state, e.g., by setting Vbl_sel=0 V (plot 1545 in FIG. 15D). Step 1422 includes setting the SGD voltage for a selected sub-block to 2.5 V (plot 1533 in FIG. 15C) and for unselected sub-blocks to 0 V (plot 1534 in FIG. 15C). Step 1423 includes increasing voltages on the selected and unselected word lines to Vpgm pass (e.g., 10 V) (plot 1503 in FIG. 15A and plot 1524 in FIG. 15B). Step 1424 includes increasing the voltage on the selected word line from Vpgm pass to Vpgm (plot 1504 in FIG. 15A) and maintaining Vpgm for a period of time (until t4). Generally, the voltage on the selected word line can be increased from the initial voltage to Vpgm in one or more steps. The voltage on the selected word line is then decreased to 0 V, for instance.

FIG. 14D depicts an example process for performing the pre-verify phase of step 1404 of FIG. 14A. Step 1430 includes increasing the voltage on the unselected word lines to a pass voltage such as Vverify pass (plot 1520a in FIG. 15B). Step 1431 includes increasing the voltage on the SGD transistors in the selected sub-block to a turn-on voltage (plot 1536a in FIG. 15C). Step 1432 includes increasing the voltage on the SGS transistors to a turn-on voltage (similar to plot 1536a in FIG. 15C). Step 1433 includes applying a pre-verify voltage pulse 1506 to WLn, which extends across all of the sub-blocks, and applying a pre-verify voltage pulse 1536 to the SGD transistors in the unselected sub-blocks, where a duration (D, FIG. 16) of the pre-verify voltage pulse is a function of the sub-block programming order. Step 1434 includes decreasing the voltage on WLn to 0 V (plot 1507, FIG. 15A) or to a first verify voltage Vv1 (plot 1508). Step 1435 includes decreasing the voltage on SGD to a turn-off voltage (0 V) (plot 1539, FIG. 15C).

FIG. 14E depicts an example process for performing the verify phase of step 1405 of FIG. 14A. Step 1440 includes providing voltages of unselected word lines at Vverify pass, e.g., 8-10 V (plot 1526 in FIG. 15B). Step 1441 includes applying a verify voltage to the selected word line (plots 1509 and 1510 in FIG. 15A). Step 1442 includes sensing the corresponding memory cells in a verify test. For instance, when VvA is applied to WLn, sensing occurs for the memory cells assigned to the A state. When VvB is applied to WLn, sensing occurs for the memory cells assigned to the B state. Step 1443 includes updating the latches based on the results of the verify tests. For example, the latches can be updated from the program state to the lockout state for memory cells which pass a verify test at step 1442. These are memory cells sensed to be in a non-conductive state, indicating that their Vth exceeds the verify voltage. A decision step 1444 determines whether there is a next verify voltage to apply to WLn. If the decision step is true, step 1441 is reached. If the decision step is false, the process is done at step 1445.

Figure 14F:
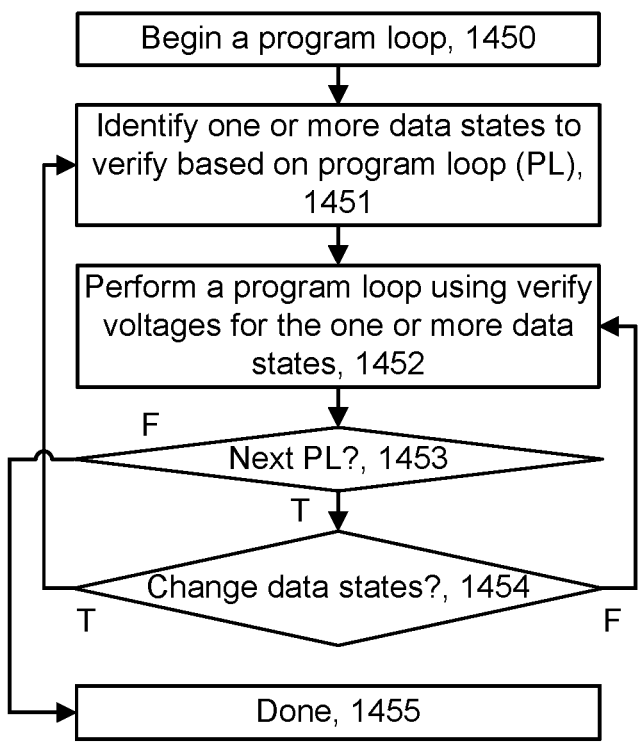
FIG. 14F depicts an example process for determining which data states to verify in FIG. 14E, consistent with FIG. 9C.

FIG. 14F depicts an example process for determining which data states to verify in FIG. 14E, consistent with FIG. 9C. As mentioned, the verification signals in the program loops can encompass lower assigned data states and then midrange assigned data states and then higher assigned data states as the program operations proceeds. The duration of the pre-verify voltage pulse in a program loop can be set as a function of the verify voltage in the program loop. See FIGS. 17 and 20. When multiple verify voltages are used in a program loop, the duration of the pre-verify voltage pulse can be set as a function of the first verify voltage among the multiple verify voltages. For example, in FIG. 15A, the first verify voltage Vv1 is applied followed by the second verify voltage Vv2, so that the duration of the pre-verify voltage pulse can be set as a function of Vv1.

In an example implementation, the verify voltage is among a plurality of verify voltages (e.g., Vv1 and Vv2) which are applied successively to the selected word line; and the duration of the pre-verify voltage pulse is a function of a first verify voltage (Vv1) of the plurality of verify voltages.

Figure 15A:
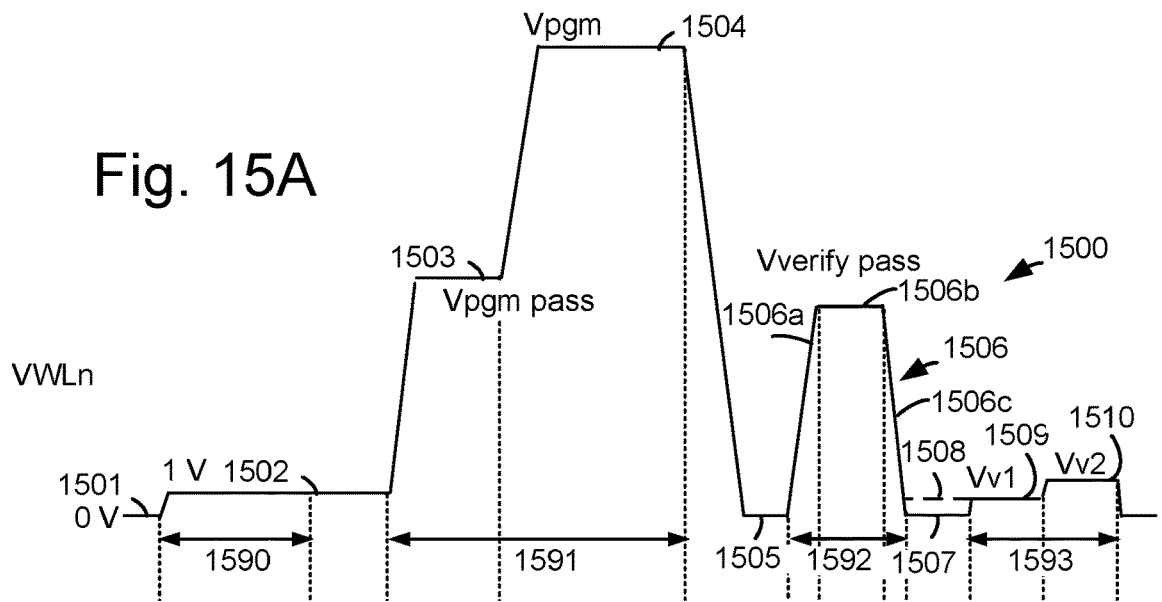
FIG. 15A-15D depicts examples of voltage signals which can be used in a program loop of a program operation, consistent with FIG. 14A-14D.

The setting of the duration of the pre-verify voltage pulse based on the first verify voltage is based on an assumption that the pre-verify voltage pulse is ramped down from its peak level to the first verify voltage Vv1 in FIG. 15A. In this case, the under drive of the WLn memory cells, and the corresponding channel gradient and amount of injection disturb, is based on Vv1. When Vv1 is lower, there is more under drive, so that the channel gradient (plot 1022) will be larger for a given voltage pulse duration. By increasing the voltage pulse duration, Vch_drain is decreased so that the channel gradient is decreased.

The voltage pulse duration can therefore be adaptively modified during a program pass so that it is at an optimum level. This can save programming time since the voltage pulse duration can be reduced when the verify voltages are higher, later in the program pass, at higher program loop numbers. See FIG. 20.

Step 1450 begins a program loop. Step 1451 identifies one or more data states to verify based on the current program loop (PL). Step 1452 performs a program loop using verify voltages for the one or more data states. A step 1453 determines if there is a next program loop. If the decision step 1453 is true, a decision step 1454 determines if the data states being verified should change. If the decision step 1454 is true, step 1451 is repeated to identify the new one or more data states to verify. If the decision step 1453 is false, the programming is done at step 1455. If the decision step 1454 is false, step 1452 is repeated, where another program loop is performed using the same verify voltages.

Steps 1451 and 1454 can be based on a fixed schedule of data states to verify versus program loop number, in one approach. In another approach, step 1451 can be based on an adaptive determination of the progress of the programming. For example, one or more higher data states can be added to verify when a specific portion of the memory cells assigned to one or more lower data states have passed their verify test. Moreover, the verify voltages for lower states can be dropped as higher verify voltages are added.

FIG. 15A-15D depicts examples of voltage signals which can be used in a program loop of a program operation, consistent with FIG. 14A-14D. The vertical dimension denotes voltage and the horizontal dimension denotes time, with time points t0-t11. The period of time depicted corresponds to one program loop and includes a pre-charge phase 1590 (t0-t1), a program phase 1591 (t2-t4), a pre-verify phase 1592 (t5-t8) and a verify phase 1593 (t9-t11). Example voltages of the signals are also depicted. A voltage signal 1500 represents VWLn, the voltage of the selected word line, a voltage signal 1520 represents Vw1_unsel, a voltage of unselected word lines, a voltage signal 1530 represents Vsgd, and a voltage signal 1540 represents Vb1, a bit line voltage.

FIG. 15A depicts voltages applied to a selected word line. A plot 1501 represents an initial voltage such as 0 V, a plot 1502 represents a pre-charge level of 1 V, and plots 1503 and 1504 represent Vpgm pass and Vpgm, respectively, in a program pulse. VWLn is then ramped down to 0 V (plot 1505). A pre-verify voltage pulse 1506 includes a ramp up portion (plot 1506a), a peak portion (plot 1506b), and a ramp down portion (plot 1506c). The voltage pulse can be ramped down to the level of the first verify voltage (plot 1508) or to 0 V (plot 1507), for example. Plots 1509 and 1510 represent first and second verify voltages Vv1 and Vv2, respectively. One or more verify voltages can be used in a program loop.

Figure 15B:
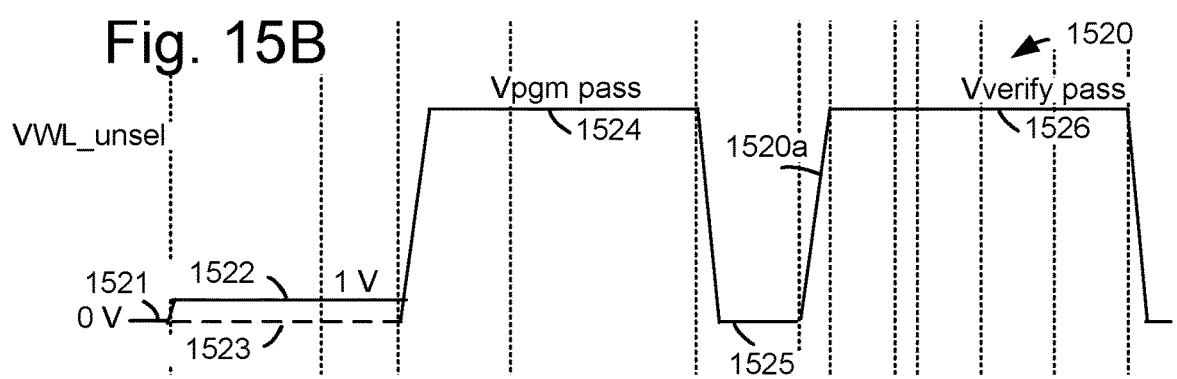

FIG. 15B depicts voltages applied to unselected word lines. VWL_unsel is initially at 0 V, for example (plot 1521). In the pre-charge phase, a plot 1522 represents 1 V on the drain-side word lines, and a plot 1523 represents 0 V on the source-side word lines. The plot 1524 represents Vpgm pass applied to the unselected word lines, and the plot 1525 represents the voltages of the unselected word lines returning to 0 V. The plot 1520a represents the word line voltages being ramped up to Vverify pass, and the plot 1526 represents the word line voltages being maintained at Vverify pass.

Figure 15C:
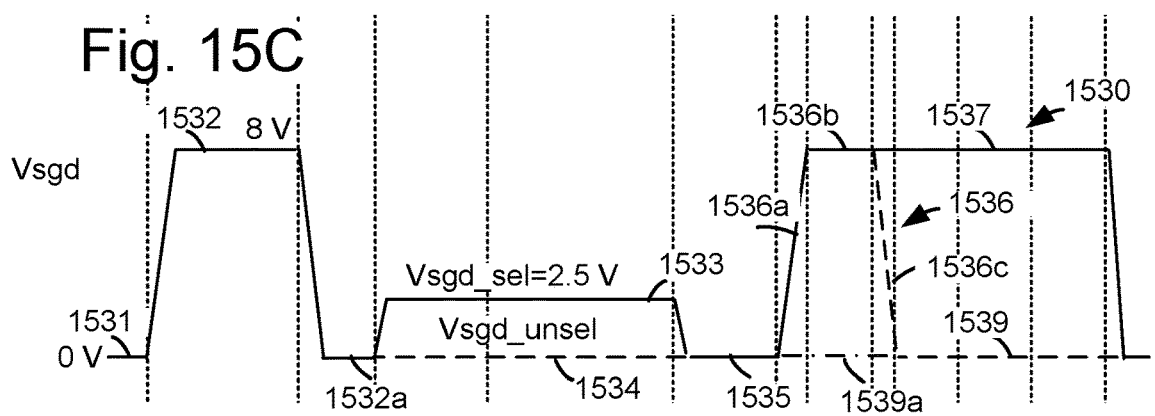

FIG. 15C depicts voltages applied to select gate transistors. The selected SGD transistors are in a selected sub-block, and the unselected SGD are in unselected sub-blocks. A plot 1531 represents an initial voltage of 0 V. A plot 1532 represents 8 V, which provides the SGD transistors in a conductive state. Subsequently, the voltage may be returned to 0 V (plot 1532a). A plot 1533 with Vsg_sel=2.5 V represents the voltage of the selected SGD transistors and a plot 1534 with Vsg_unsel=0 V represents the voltage of the unselected SGD transistors. Subsequently, the voltage may be returned to 0 V (plot 1535).

A pre-verify voltage pulse 1536 is applied to the SGD transistors in the unselected sub-blocks. The voltage pulse includes a ramp up portion (plot 1536*a*), a peak portion (plot 1536*b*) and a ramp down portion (plot 1536*c*). The pre-verify voltage pulses of the SGD transistors and WLn can be the same in magnitude and duration, in one approach. After the voltage pulse, the unselected SGD transistors receive 0 V (plot 1539) during the verify phase. The selected SGD transistors are ramped up to 8 V, for instance, at the same time as the unselected SGD transistors, but remain at 8 V during the verify phase (plot 1537).

In an option represented by a plot 1539*a*, during the increase of the voltages of the unselected word lines, a control circuit is configured to apply a turn-off voltage (e.g., 0 V) to select gate transistors of an unprogrammed unselected sub-block of the block. In this case, no pre-verify voltage pulse is applied to the unprogrammed unselected sub-block. This approach can be used, e.g., to save power, even when a pre-verify voltage pulse is applied to a programmed unselected sub-block.

Figure 15D:
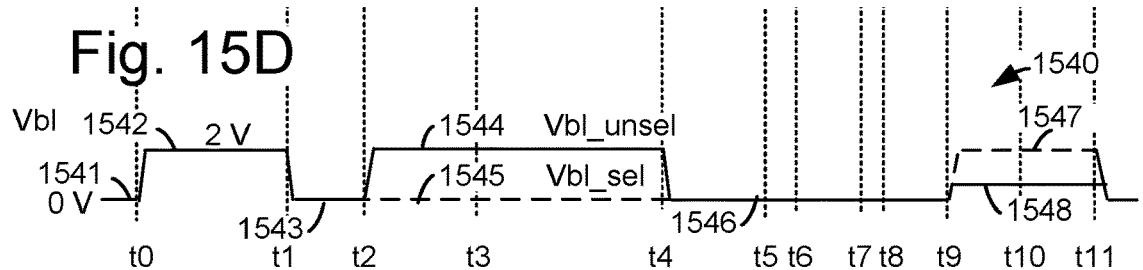

FIG. 15D depicts voltages applied to bit lines. A plot 1541 depicts an initial voltage of 0 V. A plot 1542 depicts Vbl=2 V during the pre-charge phase for selected and unselected bit lines. The selected and unselected bit lines are connected to selected and unselected NAND strings, respectively, in a selected sub-block, in one approach. Subsequently, a plot 1543 depicts Vbl returning to 0 V. A plot 1544 depicts Vb1_unsel=2 V (a voltage on unselected bit lines), and a plot 1545 depicts Vb1_sel=0 V (a voltage on selected bit lines). Subsequently, a plot 1546 depicts Vb1_unsel returning to 0 V and Vb1_sel remaining at 0 V. In the verify phase, the voltage on the unselected bit lines can be increased to 2 V (plot 1547) and the voltage on the selected bit lines can be increased to 0.5 V (plot 1548), for example.

In the pre-charge phase, a positive Vb1 (plot 1542) is provided to the drain-side of the channels of the strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain-side channel. It is also possible for the SGS transistors of the selected and unselected sub-blocks to be in a conductive state at this time, with a voltage of 8 V, for example (similar to plot 1532) to allow the source line voltage (Vs1) to be passed to the source end of the channel In the program phase, VWLn and VWL_unsel are ramped up, e.g., starting at t2, to provide a capacitive coupling up of the channels of the unselected NAND strings. VWLn is then ramped up further at t3 to the peak program pulse level of Vpgm and held at Vpgm until t4. After the program pulse, VWLn is ramped down to Vss (0 V). Subsequently, the pre-verify voltage pulses are applied. In the verify phase, one or more verify tests are performed by applying one or more verify voltages (plots 1509 and 1510) on WLn and, for each verify voltage, sensing the conductive state of the memory cells in the selected NAND strings of the selected sub-block.

During the program phase, Vsg_sel can be set to, e.g., 2.5 V, for the selected sub-block and Vsg_unsel can be set to, e.g., 0 V, for the unselected sub-blocks. With Vb1_sel=0 V (plot 1535), Vsg_sel is high enough to provide the SG_sel transistors in a conductive state for the selected NAND strings. However, it is low enough that the SG_sel transistors can be provided in a non-conductive state for the unselected NAND strings, by setting a high Vb1 for those strings. During the program and verify phases, Vb1_unsel can remain high at 2 V for the unselected NAND strings. Vb1_sel can be increased during the verify phase (plot 1548) as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase, program phase and verify phase for the selected NAND strings. Vsgd_unsel is at a reduced level such as 0 V which provides the SGD_unsel transistors in a non-conductive state for the strings in the unselected sub-blocks. After the verify phase, Vb1 is decreased to 0 V so that the SGD transistors are cutoff and the channel region has a floating voltage.

FIG. 16 depicts a close up view of the pre-verify voltage pulse 1536 of FIG. 15C and a corresponding plot 1610 of a control signal for a voltage driver. A control signal (plot 1610) can be provided to a voltage driver 446-446*c* (FIG. 3) for the unselected SGD transistors in each unselected sub-block to provide a corresponding output voltage of Vverify pass for each unselected sub-block. A similar control signal can be provided to the WLn voltage driver 447. The control signal can be provided with a step change from an initial level such as 0 V to the requested peak level (Vpeak_req, e.g., 4 V). The time points of t5, t6, t7 and t8 are consistent with FIG. 15A-15D. Intermediate time points t5*a* and t7*a* between t5 and t6, and t7 and t8, respectively, are also depicted. Before t5, the control signal requests an output of 0 V. At t5, the control signal requests an output of Vverify pass and this request is maintained until t7. At t7, the control signal again requests the output of 0 V and this request is maintained after t8.

For the WLn driver, control signal can request the output of Vv1 at t7.

The output voltage is delayed relative to the requested level. The ramp up of the voltage pulse (plot 1536*a*) shows that the voltage increases above the Vth of the SGD transistors at t5*a*, at which time the unselected SGD transistors transition to the conductive state from the non-conductive state. The voltage continues to increase until it reaches the peak level at t6. The voltage is maintained at the peak level from t6-t7 (plot 1536*b*), and begins to ramp down at t7 (plot 1536*c*). When the voltage decreases below Vth at t7*a*, the unselected SGD transistors transition to the non-conductive state from the conductive state. The SGD transistors are therefore conductive from t5*a*-t7*a* in a time period of dt. The voltage continues to decrease until t8. D represents the duration of the pre-verify voltage pulse, based on a difference between the times when the ramp up and ramp down are requested. dt is greater when D is greater.

Optionally, the pulse duration is so short that the output voltage does not reach the peak level before decreasing back to 0 V or Vv1.

Figure 17:
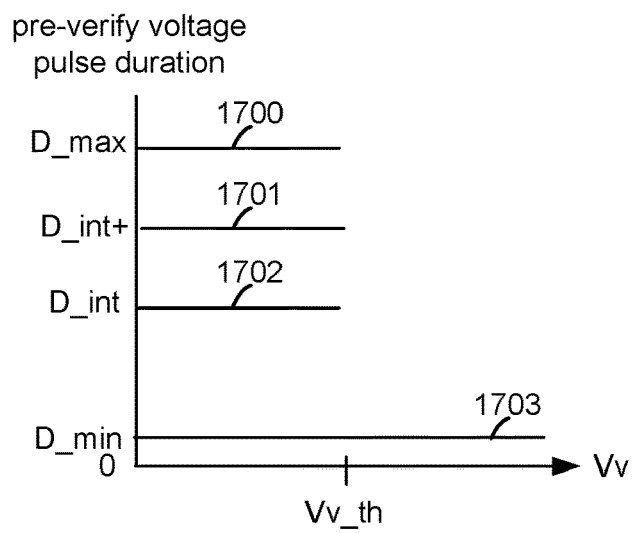
FIG. 17 depicts a plot of the duration D of the pre-verify voltage pulse of FIG. 16 versus a verify voltage.

FIG. 17 depicts a plot of the duration D of the pre-verify voltage pulse of FIG. 16 versus a verify voltage. In FIG. 15A-15D, the durations of the pre-verify voltage pulses can vary based on various factors including the location of a sub-block in the sub-block programming order of a block and a level of the verify voltage in a program loop. The duration can vary based on the physical location of a sub-block in a block The plots 1700, 1701, 1702 and 1703 denote a maximum duration D_max, an intermediate plus duration D_int+, an intermediate duration D_int and a minimum duration D_min, respectively, where D_max>D_int+>D_int>D_min. In one option, only D_min is used when the verify voltage (Vv) is greater than a threshold level Vv_th. For example, Vv_th could represent the D state in an eight-state system. Thus, when the verify voltage is for the D-G states, the pre-verify voltage pulse is set at D_min. See also FIG. 20. The programming time can be reduced by minimizing the verify pulse duration. In another option, the pre-verify voltage pulse is omitted when the verify voltage is greater than Vv_th, further reducing the program time.

When the verify voltage is at or below Vv_th, e.g., when the verify voltage is for the A-C states, one or more of the durations D_max, D_int+ and D_int can be used. In a simplified approach, the same voltage pulse duration is used for all of the unselected sub-blocks. In another approach, different unselected sub-blocks can have different voltage pulse durations based on factors such as whether the sub-block is programmed or unprogrammed and its position in the sub-block programming order. This provides a greater optimization of the voltage pulse duration and can save time and/or power.

Specific examples involving the different voltage pulse durations are provided below.

FIG. 18A depicts a plot of the duration D of the pre-verify voltage pulse of FIG. 16 versus an unselected sub-block when SB0 is a selected sub-block. The squares indicate that the pre-verify voltage pulse duration is D_min for SB1-SB3. In FIG. 18A-18D, the squares represent a fine-grained approach in which durations between D_min and D_max can be used and the triangles represent a coarse-grained or binary approach in which only D_min and D_max are used. Additionally, a general approach is that D_min can be used for unselected sub-blocks which are unprogrammed. Higher durations can be used for unselected sub-blocks which are programmed.

In the fine-grained approach, the duration of the voltage pulse for one unselected programmed sub-block is relatively greater when the number of sub-blocks which have been programmed after the unselected programmed sub-block is relatively greater. For example, in FIG. 18A, all of the unselected sub-blocks SB1-SB3 are unprogrammed so the duration is D_min for SB0. In one approach, the duration of the pre-verify voltage pulse for one programmed unselected sub-block is relatively longer when a number of sub-blocks in the block which are programmed after the one programmed unselected sub-block and before the selected sub-block is relatively larger.

FIG. 18B depicts a plot of the duration D of the pre-verify voltage pulse of FIG. 16 versus an unselected sub-block when SB1 is a selected sub-block. The unselected sub-block SB0 is programmed but no other sub-blocks have been programmed after it at the time SB1 is being programmed. The unselected sub-blocks SB2 and SB3 are unprogrammed. The squares indicate that the pre-verify voltage pulse duration is D_int for SB0, SB2 and SB3. In an option, the triangles indicate that the pre-verify voltage pulse duration is D_max for SB0, SB2 and SB3. This assumes a simpler implementation in which the same voltage signal and timing is used for the unselected sub-blocks.

If different voltage signals and timing were used for the different unselected sub-blocks, it would be possible to have a different pulse duration for each sub-block. In one option, the pulse duration could be higher for programmed sub-blocks (e.g., D_int, D_int+ or D_max) compared to unprogrammed sub-blocks, which could have a duration of D_min or no pre-verify pulse.

In one implementation, a control circuit is configured to apply a pre-verify voltage pulse to select gate transistors of an unprogrammed unselected sub-block (SB2 or SB3) of a block concurrent with the increase of the voltages of the unselected word lines; and a duration (D_min) of the pre-verify voltage pulse applied to the select gate transistors of the unprogrammed unselected sub-block is less than the duration (D_int or D_max) of the pre-verify voltage pulse applied to the select gate transistors of the one programmed unselected sub-block (SB0).

FIG. 18C depicts a plot of the duration D of the pre-verify voltage pulse of FIG. 16 versus an unselected sub-block when SB2 is a selected sub-block. The unselected sub-block SB0 is programmed and one other sub-block (SB1) has been programmed after it at the time SB2 is being programmed. The unselected sub-block SB1 is also programmed but no other sub-blocks have been programmed after it at the time SB1 is being programmed. The unselected sub-block SB3 is unprogrammed. The squares indicate that the pre-verify voltage pulse duration is D_int+ for SB0, SB1 and SB3. In an option, the triangles indicates that the pre-verify voltage pulse duration is D_max for SB0, SB1 and SB3. In another option, with different voltage signals and timings, the pulse duration could be D_int+ for SB0, D_int for SB1 and D_min for SB3, or D_int+ for SB0 and SB1, and D_min for SB3.

FIG. 18D depicts a plot of the duration D of the pre-verify voltage pulse of FIG. 16 versus an unselected sub-block when SB3 is a selected sub-block. The unselected sub-block SB0 is programmed and two other sub-blocks (SB1 and SB2) have been programmed after it at the time SB3 is being programmed. The unselected sub-block SB1 is programmed and one other sub-block (SB2) has been programmed after it at the time SB3 is being programmed. The unselected sub-block SB2 is also programmed but no other sub-blocks have been programmed after it at the time SB3 is being programmed. The squares indicate that the pre-verify voltage pulse duration is D_max for SB0-SB2. In an option, with different voltage signals and timings, the pulse duration could be D_max for SB0, D_int+ for SB1 and D_int for SB2.

After a block has been programmed, SB0 has been subject to the injection type of disturb three times as often as SB2, and SB1 has been subject to the injection type of disturb twice as often as SB2. The last-programmed sub-block of a block, SB3, has not been subject to the injection type of disturb. The voltage pulse duration is therefore greater for a sub-block which has been subject to the injection type of disturb more frequently. In an implementation in which the unselected sub-blocks have the same voltage signal and timing, the pulse duration can be the same for all of the unselected sub-blocks, including the programmed and unprogrammed sub-blocks, a shown in FIG. 8A-18D. This provides a simpler implementation. The pulse duration can be set at the level which is appropriate for the worst-case unselected sub-block, that is, the sub-block which has been subject to the injection type of disturb most often during the programming of the block. In another possible option, the pulse duration can be set at the level which is appropriate for the worst-case unselected sub-block for the unselected programmed sub-blocks while D_min or no pulse is used for the unselected unprogrammed sub-blocks.

In one approach, a control circuit is configured to apply a pre-verify voltage pulse to select gate transistors in another programmed unselected sub-block (e.g., SB1 or SB2) of the block concurrent with the increase of the voltages of the unselected word lines (plot 1520a in FIG. 15B); and a duration (D_int+ or D_int, FIG. 18D) of the pre-verify voltage pulse for the another programmed unselected sub-block is less than the duration (D_max) of the pre-verify voltage pulse for the one programmed unselected sub-block (e.g., SB0) when the another programmed unselected sub-block is programmed after the one programmed unselected sub-block, e.g., in the sub-block programming order of SB0, SB1, SB2 and SB3.

FIG. 19 depicts a process for setting the duration of a pre-verify voltage pulse for unselected sub-blocks, consistent for FIG. 18A-18D. The process may be performed at the beginning of a program operation, program pass or program loop, for example. Step 1900 begins a process to set a pre-verify voltage pulse duration for unselected sub-blocks when programming a selected sub-block. In one option, at step 1901, an unselected sub-block is unprogrammed. This is an unprogrammed unselected sub-block. In this case, step 1902 indicates that the duration D=D_min. Optionally, no pre-verify voltage pulse is used for the unselected sub-block, e.g., D=0.

In another case, the unselected sub-block is programmed, at step 1903. This is a programmed unselected sub-block. Three options are depicted in the example of four sub-blocks in a block, consistent with FIG. 7. In a first option, step 1904 indicates that one other sub-block has been programmed before the selected sub-block, in which case step 1905 sets the duration D=D_int. In a second option, step 1906 indicates that two other sub-blocks have been programmed before the selected sub-block, in which case step 1907 sets the duration higher to D=D_int+. In a third option, step 1908 indicates that three other sub-blocks have been programmed before the selected sub-block, in which case step 1909 sets the duration even higher D=D_max. FIG. 19 represents the fine-grained option of using more than two durations.

In a further option, the unselected sub-blocks are grouped so that unselected sub-blocks in a group have the same pre-verify voltage pulse duration.

FIG. 20 depicts an example of a pre-verify voltage pulse duration in a sub-block SBi as a function of program loop number, consistent with FIG. 9C, when sub-blocks SBi+1 to SBi+3 are selected. As mentioned, the pre-verify voltage pulse duration can be a function of the verify voltage, where a lower verify voltage is associated with a larger channel gradient between WLn and WLn+1 and therefore a greater risk of injection disturb for the WLn+1 memory cells in the unselected sub-blocks. When there is a greater risk of injection disturb, the pre-verify voltage pulse duration can be increased to provide a stronger countermeasure. Moreover, the verify voltage is related to the program loop number as noted in FIG. 9C.

In this example, the pre-verify voltage pulse duration is higher when the program loop number is lower, since this is when the verify voltage is lower, in a program pass. The pre-verify voltage pulse duration is also higher for a given unselected sub-block when the number of sub-blocks which have been programmed after the given sub-block is greater. In other words, the pre-verify voltage pulse duration is higher for a given unselected sub-block when the number of times the given unselected sub-block has been subject to the injection type of disturb is greater.

For example, the bars 2000 represent the pulse durations on SBi when SBi+1 is selected. The index "i" represents a particular sub-block and the index "i+1" represents the sub-which is programmed directly after the ith sub-block. For instance, the bars represent the pulse duration on SB0 when SB1 is selected, on SB1 when SB2 is selected and on SB2 when SB3 is selected. When the program loop PL=1-10, corresponding to verify tests for the A-C states, the duration D=D_int. When the program loop PL=11-22, corresponding to verify tests for the D-G states, the duration is lowered to D=D_min.

The bars 2010 represent the pulse durations on SBi when SBi+2 is selected. For instance, the bars represent the pulse durations on SB0 when SB2 is selected, and on SB1 when SB3 is selected. When the program loop PL=1-10, the duration D=D_int+. When the program loop PL=11-22, the duration is lowered to D=D_min.

The bars 2020 represent the pulse durations on SBi when SBi+3 is selected. For instance, the bars represent the pulse durations on SB0 when SB3 is selected. When the program loop PL=1-10, the duration D=D_max. When the program loop PL=11-22, the duration is lowered to D=D_min.

The bars 2030 are alternative to the bars 2020. In this case, the program loop number at which the duration transitions to a lower level is greater. Specifically, when the program loop PL=1-13, corresponding to verify tests for the A-D states, the duration D=D_max. When the program loop PL=14-22, corresponding to verify tests for the E-G states, the duration is lowered to D=D_min. This example shows that the program loop number at which the duration transitions to a lower level for a given unselected sub-block when a selected sub-block is programmed is greater when the number of sub-blocks which have been programmed after the given unselected sub-block and before the selected sub-block is greater.

In an example, the memory cells connected to the selected word line in the selected sub-block are assigned to a plurality of data states, e.g., A-G, the plurality of data states are arranged in groups, e.g., A-C and D-G, and the duration is a function of one of the groups which is associated with the verify voltage.

FIG. 20 could be extended to encompass more than three groups of data states. For example, D_max can be used when the data states being verified are in a first group of A-C, D_int+ or D_int can be used when the data states being verified are in a second group of D and E, and D_min can be used when the data states being verified are in a third group of E-G.

The duration of the pre-verify voltage pulse can be relatively longer when the verify voltage is relatively lower, in a current program loop.

In an example implementation, an apparatus comprises: a set of memory cells arranged in NAND strings in a block, each NAND string has a drain-end and a source end, and a select gate transistor at the drain-end; a selected word line and unselected word lines connected to the set of memory cells; and a control circuit, the control circuit, to program memory cells connected to the selected word line in a selected sub-block of the block, is configured to: apply a program pulse to the selected word line; after the applying of the program pulse, increase voltages of the unselected word lines to pass voltages; apply a pre-verify voltage pulse to select gate transistors in one programmed unselected sub-block of the block, wherein the applying of the pre-verify voltage pulse to the select gate transistors in the one programmed unselected sub-block is concurrent with the increase of the voltages of the unselected word lines, and a duration of the pre-verify voltage pulse is a function of a sub-block programming order of the block; and after the pre-verify voltage pulse, apply a verify voltage to the selected word line.

In another example implementation, a method comprises: applying a program pulse to a selected word line in a set of word lines, the set of word lines are connected to a set of memory cells arranged in NAND strings in a block, each NAND string has a drain-end and a source end, and a select gate transistor at the drain-end and the program pulse is part of a program operation for memory cells connected to the selected word line in a selected sub-block; after the applying of the program pulse, performing a channel boosting operation for NAND strings in an unselected sub-block of the block, the performing the channel boosting operation comprises increasing voltages of unselected word lines in the set of word lines to pass voltages and applying a pre-verify voltage pulse to the selected word line and to select gate transistors in an unselected sub-block; and after the performing of the channel boosting operation, applying a verify voltage to the selected word line while performing a verify test for the memory cells connected to the selected word line in the selected sub-block.

In another example implementation, an apparatus comprises: a set of memory cells arranged in NAND strings in a block, each NAND string has a drain-end and a source end, and a select gate transistor at the drain-end; a selected word line and unselected word lines connected to the set of memory cells; and a control circuit. The control circuit, to program memory cells connected to the selected word line in a selected sub-block of the block, is configured to: apply a program pulse to the selected word line; after the applying of the program pulse, increase voltages of the unselected word lines in the set of word lines to pass voltages and apply a pre-verify voltage pulse to the selected word line and to select gate transistors in an unselected sub-block of the block; and subsequently perform a verify test for the memory cells connected to the selected word line in the selected sub-block.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings in a block, each NAND string has a drain-end and a source end, and a select gate transistor at the drain-end;
a selected word line and unselected word lines connected to the set of memory cells; and
a control circuit, the control circuit, to program memory cells connected to the selected word line in a selected sub-block of the block, is configured to:
apply a program pulse to the selected word line;
after the applying of the program pulse, increase voltages of the unselected word lines to pass voltages;
apply a pre-verify voltage pulse to select gate transistors in one programmed unselected sub-block of the block, wherein the applying of the pre-verify voltage pulse to the select gate transistors in the one programmed unselected sub-block is concurrent with the increase of the voltages of the unselected word lines, and a duration of the pre-verify voltage pulse is a function of a sub-block programming order of the block; and
after the pre-verify voltage pulse, apply a verify voltage to the selected word line.

2. The apparatus of claim 1, wherein:
the control circuit is configured to apply a pre-verify voltage pulse to the selected word line concurrently with the applying of the pre-verify voltage pulse to the select gate transistors in the one programmed unselected sub-block.

3. The apparatus of claim 1, wherein:
the duration is relatively longer when a number of sub-blocks in the block which are programmed after the one programmed unselected sub-block and before the selected sub-block is relatively larger.

4. The apparatus of claim 1, wherein:
the control circuit is configured to apply a pre-verify voltage pulse to select gate transistors in another programmed unselected sub-block of the block concurrent with the increase of the voltages of the unselected word lines; and
a duration of the pre-verify voltage pulse for the another programmed unselected sub-block is less than the duration of the pre-verify voltage pulse for the one programmed unselected sub-block when the another programmed unselected sub-block is programmed after the one programmed unselected sub-block.

5. The apparatus of claim 1, wherein:
the verify voltage is among a plurality of verify voltages which are applied successively to the selected word line; and
the duration is a function of a first verify voltage of the plurality of verify voltages.

6. The apparatus of claim 1, wherein:
the memory cells connected to the selected word line in the selected sub-block are assigned to a plurality of data states;
the plurality of data states are arranged in groups; and
the duration is a function of one of the groups which is associated with the verify voltage.

7. The apparatus of claim 1, wherein:
the duration is relatively longer when the verify voltage is relatively lower.

8. The apparatus of claim 1, wherein:
the control circuit is configured to apply a pre-verify voltage pulse to select gate transistors of an unprogrammed unselected sub-block of the block concurrent with the increase of the voltages of the unselected word lines; and
a duration of the pre-verify voltage pulse applied to the select gate transistors of the unprogrammed unselected sub-block is less than the duration of the pre-verify voltage pulse applied to the select gate transistors of the one programmed unselected sub-block.

9. The apparatus of claim 1, wherein:
during the increase of the voltages of the unselected word lines, the control circuit is configured to apply a turn-off voltage to select gate transistors of an unprogrammed unselected sub-block of the block.

10. The apparatus of claim 1, wherein:
the memory cells connected to the selected word line are programmed in a single-pass program operation;
the unselected word lines comprise source-side word lines of the selected word line and drain-side word lines of the selected word line;
the pass voltages comprise a pass voltage for the source-side word lines and a pass voltage for the drain-side word lines; and
the pass voltage for the drain-side word lines is less than the pass voltage for the source-side word lines.

11. The apparatus of claim 1, wherein:
memory cells connected to an adjacent drain-side word line of the selected word line are programmed before the programming of the memory cells connected to the selected word line;
the unselected word lines comprise the adjacent drain-side word line and remaining drain-side word lines;
the pass voltages comprise a pass voltage for the adjacent drain-side word line and a pass voltage for the remaining drain-side word lines; and
the pass voltage for the remaining drain-side word lines is less than the pass voltage for the adjacent drain-side word line.

12. The apparatus of claim 1, wherein:
the programming of the memory cells connected to the selected word line in the selected sub-block occurs in a foggy programming pass of a foggy-fine multi-pass program operation.

13. A method, comprising:
applying a program pulse to a selected word line in a set of word lines, the set of word lines are connected to a set of memory cells arranged in NAND strings in a block, each NAND string has a drain-end and a source end, and a select gate transistor at the drain-end and the program pulse is part of a program operation for memory cells connected to the selected word line in a selected sub-block;
after the applying of the program pulse, performing a channel boosting operation for NAND strings in an unselected sub-block of the block, the performing the channel boosting operation comprises increasing voltages of unselected word lines in the set of word lines to pass voltages and applying a pre-verify voltage pulse to the selected word line and to select gate transistors in an unselected sub-block; and
after the performing of the channel boosting operation, applying a verify voltage to the selected word line while performing a verify test for the memory cells connected to the selected word line in the selected sub-block.

14. The method of claim 13, wherein:
a duration of the pre-verify voltage pulse is a function of the verify voltage.

15. The method of claim 13, wherein:
a duration of the pre-verify voltage pulse is a function of a position of the unselected sub-block in the block and a sub-block programming order of the block.

16. The method of claim 13, wherein:
the unselected sub-block is programmed before the selected sub-block.

17. An apparatus, comprising:
a set of memory cells arranged in NAND strings in a block, each NAND string has a drain-end and a source end, and a select gate transistor at the drain-end;
a selected word line and unselected word lines connected to the set of memory cells; and
a control circuit, the control circuit, to program memory cells connected to the selected word line in a selected sub-block of the block, is configured to:
apply a program pulse to the selected word line;
after the applying of the program pulse, increase voltages of the unselected word lines in the set of word lines to pass voltages and apply a pre-verify voltage pulse to the selected word line and to select gate transistors in an unselected sub-block of the block; and
subsequently perform a verify test for the memory cells connected to the selected word line in the selected sub-block.

18. The apparatus of claim 17, wherein:
a duration of the pre-verify voltage pulse is a function of a data state associated with the verify test.

19. The apparatus of claim 17, wherein:
a duration of the pre-verify voltage pulse is a function of a position of the unselected sub-block in the block and a sub-block programming order of the block.

20. The apparatus of claim 17, wherein:
the unselected sub-block is programmed before the selected sub-block.

* * * * *